US010154579B2

(12) United States Patent
Yamauchi et al.

(10) Patent No.: US 10,154,579 B2
(45) Date of Patent: Dec. 11, 2018

(54) PRINTED CIRCUIT BOARD AND METHOD OF MANUFACTURING THE SAME

(71) Applicant: Nitto Denko Corporation, Ibaraki-shi, Osaka (JP)

(72) Inventors: Daisuke Yamauchi, Ibaraki (JP); Hiroyuki Tanabe, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/597,686

(22) Filed: May 17, 2017

(65) Prior Publication Data

US 2017/0339781 A1    Nov. 23, 2017

(30) Foreign Application Priority Data

May 18, 2016  (JP) .................................. 2016-099713

(51) Int. Cl.
| | | |
|---|---|---|
| H05K 1/02 | (2006.01) |
| H05K 1/05 | (2006.01) |
| H05K 1/09 | (2006.01) |
| H05K 3/46 | (2006.01) |
| H05K 1/11 | (2006.01) |
| G11B 5/48 | (2006.01) |
| H05K 1/18 | (2006.01) |

(52) U.S. Cl.
CPC ......... *H05K 1/0216* (2013.01); *H05K 1/0281* (2013.01); *H05K 1/05* (2013.01); *H05K 1/09* (2013.01); *H05K 3/4644* (2013.01); *G11B 5/486* (2013.01); *G11B 5/4853* (2013.01); *H05K 1/11* (2013.01); *H05K 1/189* (2013.01); *H05K 2201/09036* (2013.01)

(58) Field of Classification Search
CPC ...... H05K 1/0216; H05K 3/4644; H05K 1/09; H05K 1/05; H05K 2201/09036
See application file for complete search history.

(56) References Cited

U.S. PATENT DOCUMENTS 5,796,552 A * 8/1998 Akin, Jr. ............. G11B 5/4846
                                                     360/264.2
7,465,884 B2 * 12/2008 Ooyabu ................. G11B 5/486
                                                        174/255
(Continued)

FOREIGN PATENT DOCUMENTS

JP      2004133988 A    4/2004
JP      2006245220 A    9/2006
(Continued)

*Primary Examiner* — Ishwarbhai B Patel
(74) *Attorney, Agent, or Firm* — Panitch Schwarze Belisario & Nadel LLP

(57) ABSTRACT

A first insulating layer is formed on a support substrate. The first insulating layer includes a first portion and a second portion. The second portion has a thickness smaller than that of the first portion. A ground layer having electric conductivity higher than that of the support substrate is formed on the second portion of the first insulating layer. The ground layer is electrically connected to the support substrate. A second insulating layer is formed on the first insulating layer to cover the ground layer. A write wiring trace is formed on the second insulating layer to overlap with the first portion and the second portion of the first insulating layer.

6 Claims, 26 Drawing Sheets

(56) References Cited

U.S. PATENT DOCUMENTS

| | | | |
|---|---|---|---|
| 8,134,080 B2* | 3/2012 | Ishii | H05K 3/38 |
| | | | 174/255 |
| 2004/0070884 A1 | 4/2004 | Someya et al. | |
| 2004/0246626 A1* | 12/2004 | Wakaki | G11B 5/486 |
| | | | 360/245.8 |
| 2006/0199402 A1 | 9/2006 | Ishii et al. | |
| 2007/0128417 A1* | 6/2007 | Ishii | H05K 1/056 |
| | | | 428/209 |
| 2008/0047739 A1 | 2/2008 | Ishii et al. | |
| 2008/0278858 A1 | 11/2008 | Ishii et al. | |
| 2009/0316300 A1 | 12/2009 | Kamei et al. | |
| 2015/0382451 A1 | 12/2015 | Tanabe et al. | |

FOREIGN PATENT DOCUMENTS

| | | |
|---|---|---|
| JP | 2008034639 A | 2/2008 |
| JP | 2008282995 A | 11/2008 |
| JP | 2010003893 A | 1/2010 |
| JP | 2012198950 A | 10/2012 |
| JP | 2016012706 A | 1/2016 |

* cited by examiner

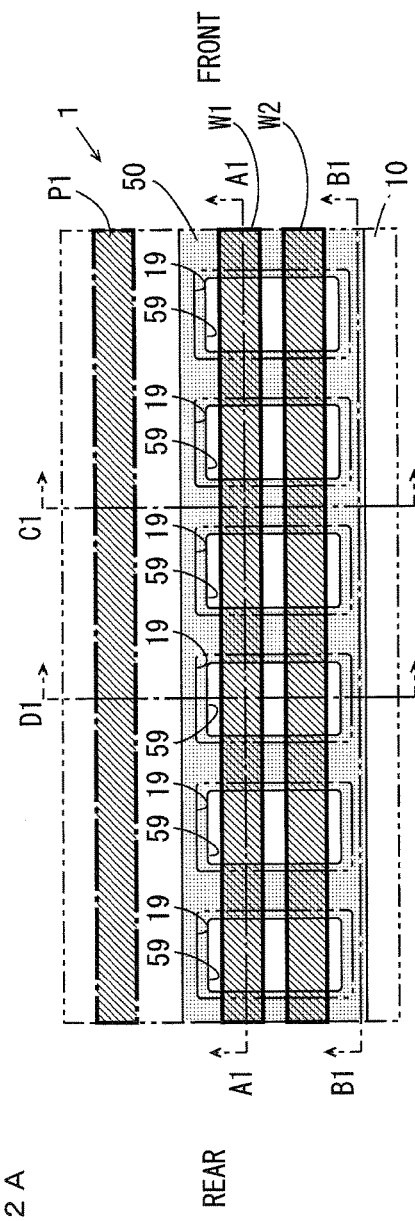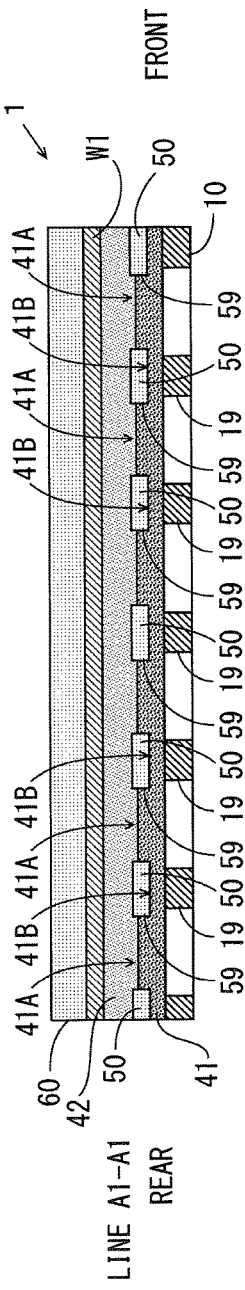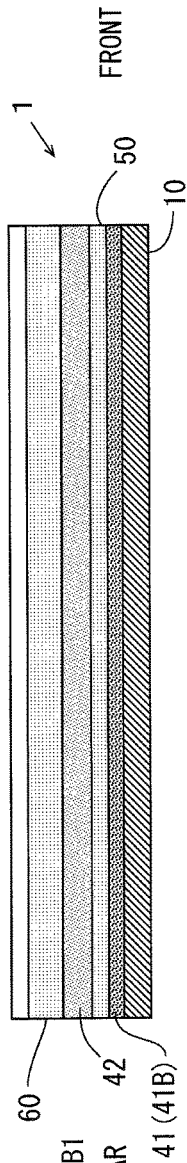

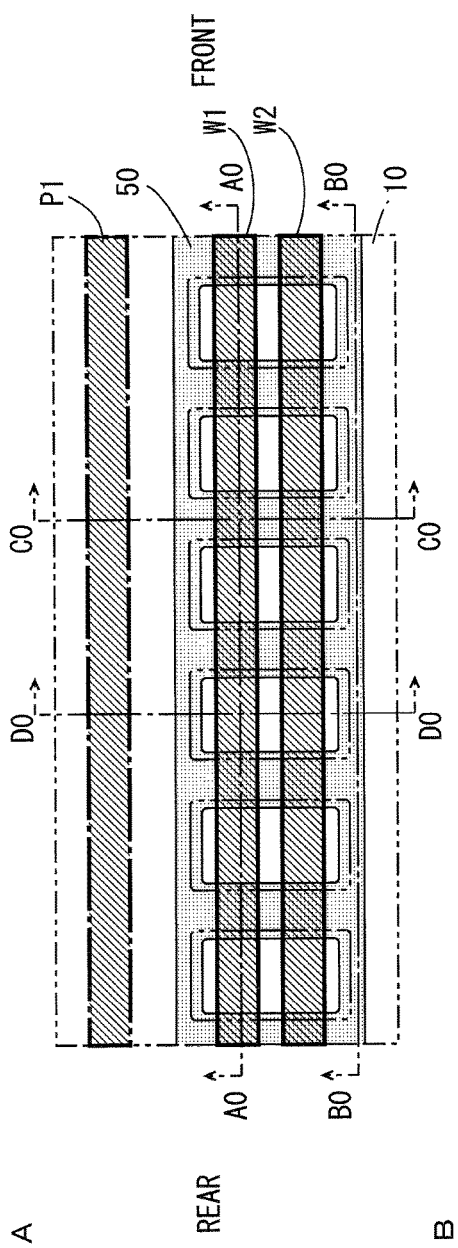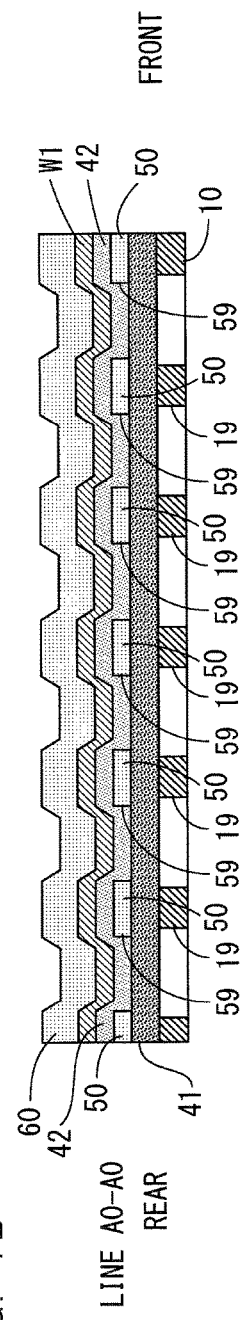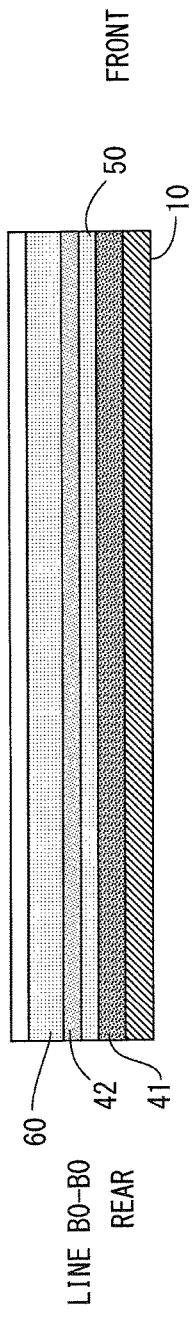

LINE C1-C1

LINE D1-D1

LINE C1-C1

LINE D1-D1

LINE C1-C1

LINE D1-D1

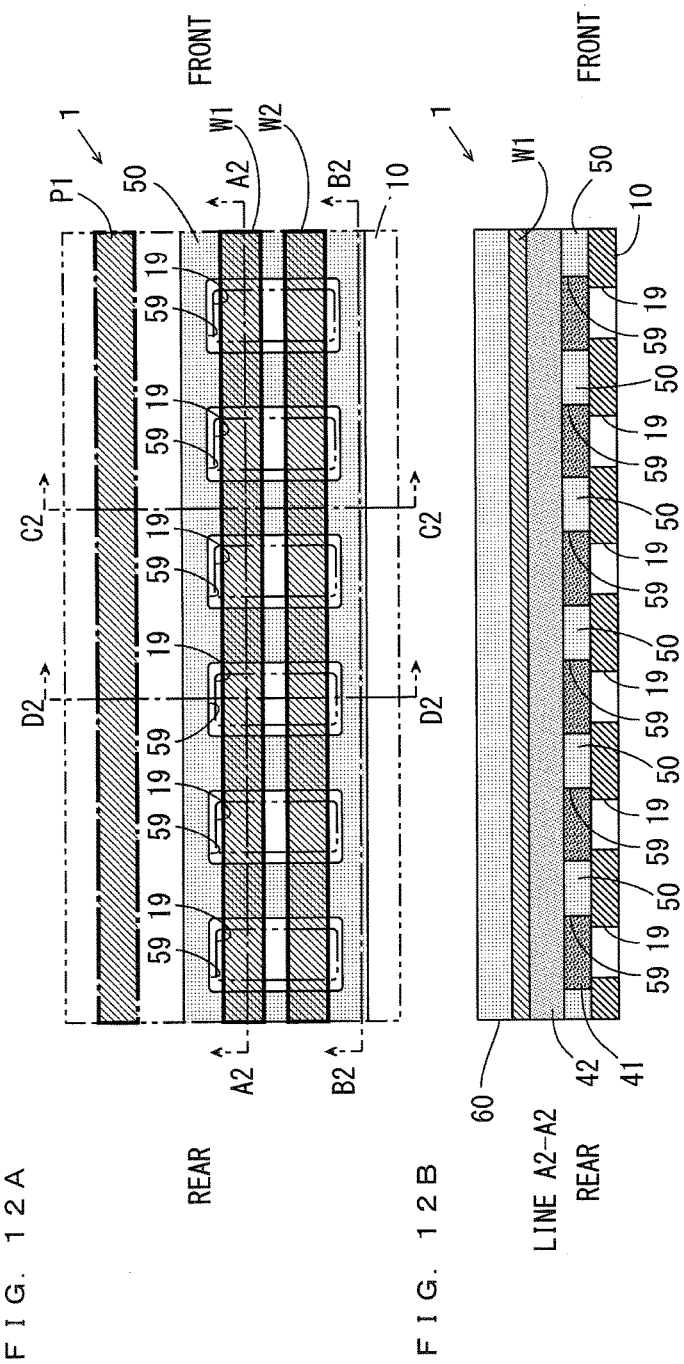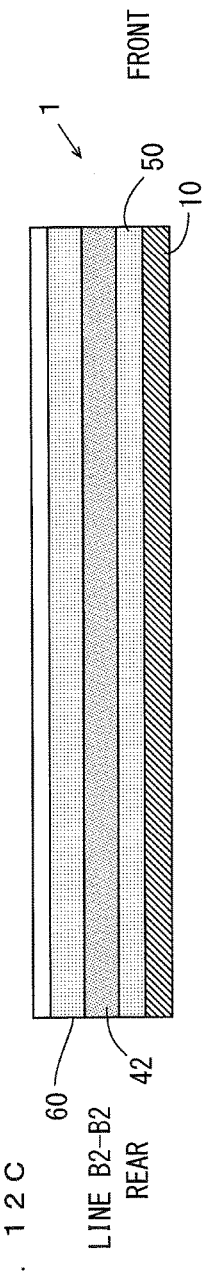

LINE C2-C2

LINE D2-D2

LINE C2-C2

LINE D2-D2

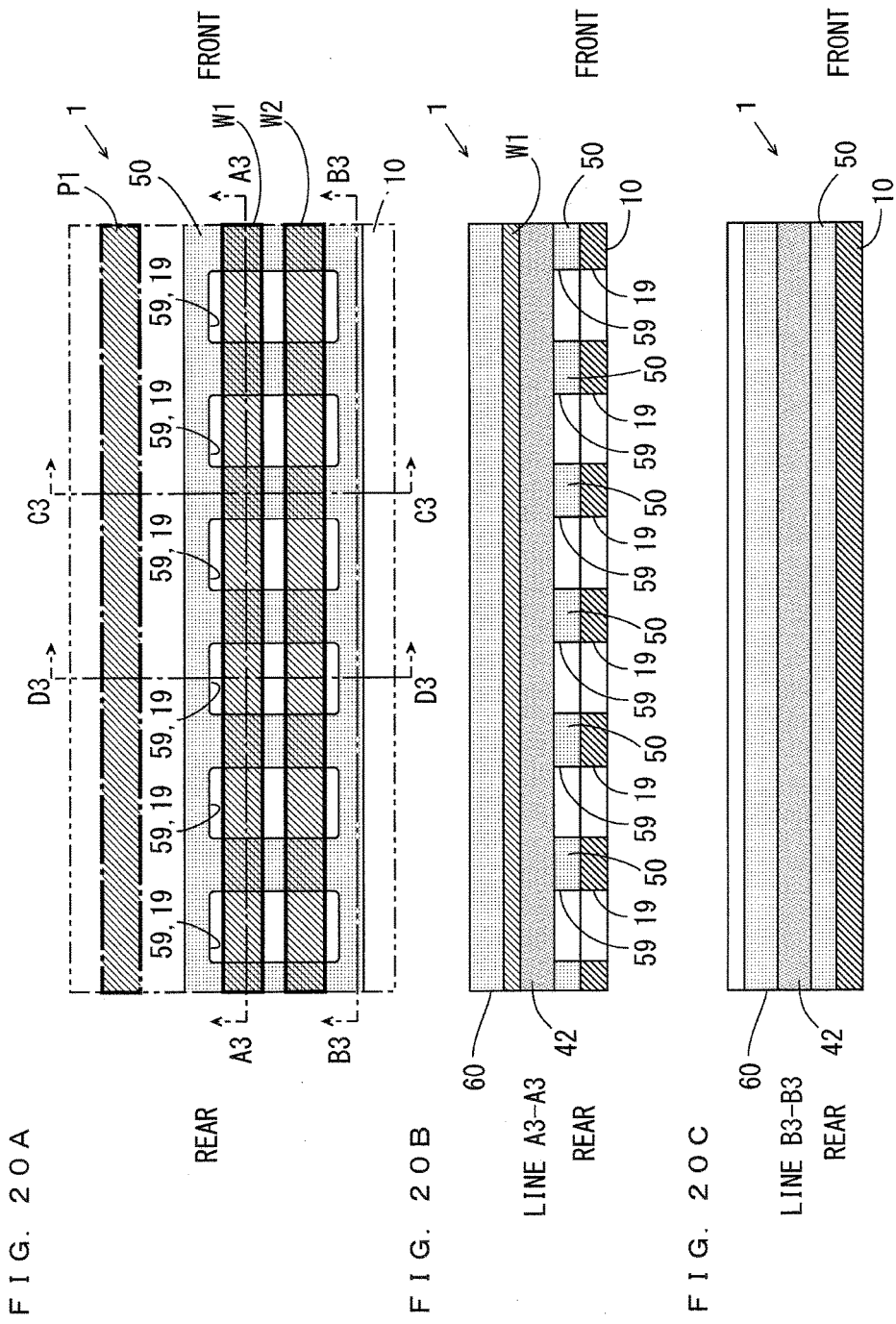

LINE F1-F1

LINE G1-G1

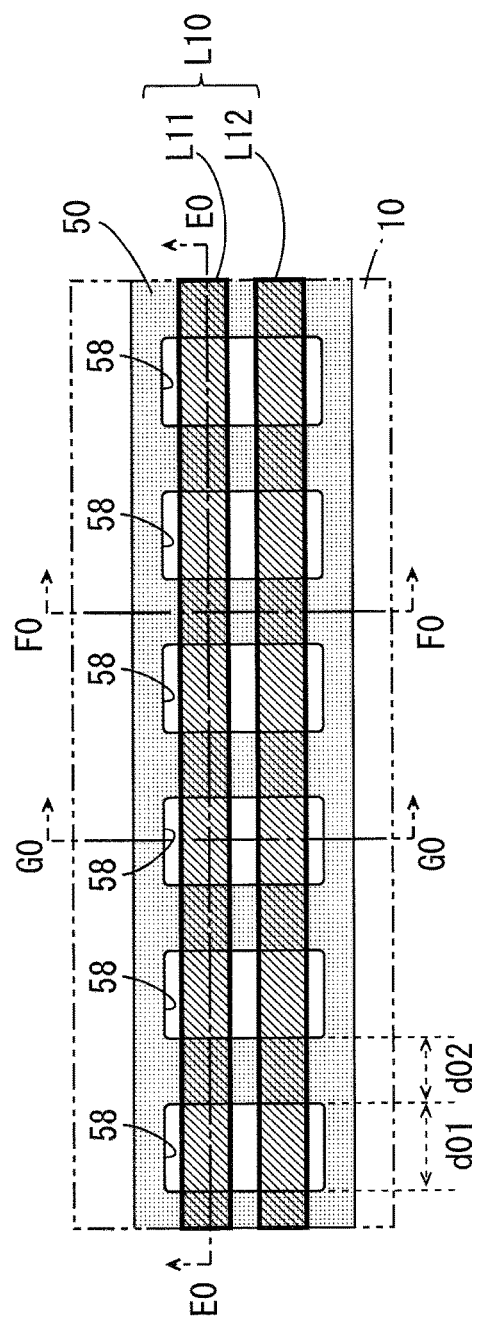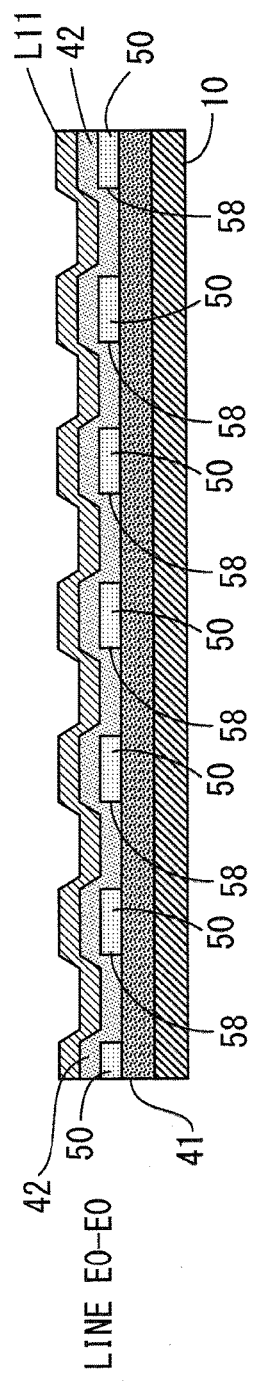
FIG. 24A
FIG. 24B

PRINTED CIRCUIT BOARD AND METHOD OF MANUFACTURING THE SAME

BACKGROUND OF THE INVENTION

Field of the Invention

The present invention relates to a printed circuit board and a method of manufacturing the printed circuit board.

Description of Related Art

Conventionally, printed circuit boards have been used in various types of electric equipment and electronic equipment. In JP 2010-3893 A, a suspension board used for an actuator in a hard disc drive device is described as a printed circuit board.

In the printed circuit board described in JP 2010-3893 A, a first insulating layer is formed on a suspension main body. First and second wiring traces are formed on the first insulating layer to be spaced apart from each other and be in parallel to each other. Two second insulating layers are formed in two regions on the first insulating layer such that the first wiring trace and the second wiring trace are positioned between the two second insulating layers. A third wiring trace is formed in a region on the second insulating layer close to the second wiring trace, and a fourth wiring trace is formed in a region on the second insulating layer close to the first wiring trace.

The first wiring trace and the third wiring trace are connected to each other in a predetermined location, so that a first write wiring trace is constituted. The second wiring trace and the fourth wiring trace are connected to each other in a predetermined location, so that a second write wiring trace is constituted. The first write wiring trace and the second write wiring trace constitute a signal line pair.

In the printed circuit board described in JP 2010-3893 A, the first and second wiring traces are formed at positions lower than the third and fourth wiring traces. Therefore, as compared to the case where the first to fourth wiring traces are formed on the same plane, a distance between the first and third wiring traces, a distance between the second and fourth traces, and a distance between the second and third traces are respectively increased. This reduces the proximity effect among the first to fourth wiring traces. Thus, a loss of an electric signal transmitted through each of the first to fourth wiring traces is reduced.

BRIEF SUMMARY OF THE INVENTION

However, in recent years, electric signals used in electric equipment or electronic equipment have higher frequencies. Therefore, a further reduction in transmission loss of an electric signal in a high frequency band in the printed circuit board is required.

The present invention provides a printed circuit board in which a loss of an electric signal is reduced in a high frequency band. The present invention further provides a method of manufacturing the printed circuit board.

(1) A printed circuit board according to one aspect of the present invention includes a support substrate formed of a conductive material, a first insulating layer that is formed on the support substrate and includes a first portion having a first thickness and a second portion having a second thickness smaller than the first thickness, a ground layer that is formed on the second portion of the first insulating layer to be electrically connected to the support substrate and has electric conductivity higher than that of the support substrate, a second insulating layer formed on the first insulating layer to cover the ground layer, and an upper wiring trace formed on the second insulating layer to overlap with the first and second portions of the first insulating layer.

In the printed circuit board, the first insulating layer including the first and second portions is formed on the support substrate. The ground layer is formed on the second portion of the first insulating layer. Further, the second insulating layer is formed on the first insulating layer to cover the ground layer. Further, the upper wiring trace is formed on the second insulating layer to overlap with the first and second portions of the first insulating layer. In this case, an electric signal can be transmitted through the upper wiring trace.

In the case where an electric signal having a high frequency band is transmitted through the upper wiring trace, electromagnetic waves are generated from the upper wiring trace. When the electromagnetic waves enter the support substrate or the ground layer, an eddy current is generated in the support substrate or the ground layer, and the upper wiring trace is electromagnetically coupled to the support substrate or the ground layer. A loss, corresponding to the magnitude of the eddy current generated in the support substrate or the ground layer, of the electric signal transmitted through the upper wiring trace is generated. The larger the eddy current is, the larger the loss of the electric signal is. Further, the smaller the eddy current is, the smaller the loss of the electric signal is.

As for an eddy current generated in a conductor when electromagnetic waves are supplied to the conductor, the lower the electric conductivity of the conductor is, the larger the eddy current is. Further, the higher the electric conductivity of the conductor is, the smaller the eddy current is. The ground layer has the electric conductivity higher than that of the support substrate. Therefore, an eddy current generated in the ground layer by electromagnetic waves is smaller than an eddy current generated in the support substrate by electromagnetic waves.

In the above-mentioned configuration, the ground layer is positioned between at least part of the upper wiring trace and the support substrate, so that electromagnetic waves radiated from the upper wiring trace towards the support substrate at least partially enter the ground layer and does not reach the support substrate.

Further, in the case where an electric signal having a high frequency band is transmitted through the upper wiring trace, a loss, corresponding to a line length of the upper wiring trace, of the electric signal transmitted through the upper wiring trace is generated. The larger the line length of the upper wiring trace is, the larger the loss of the electric signal is. Further, the smaller the line length of the upper wiring trace is, the smaller the loss of the electric signal is. In the printed circuit board according to the present invention, the ground layer is formed on the second portion of the first insulating layer. In this case, in the stacking direction of the support substrate, the first insulating layer and the second insulating layer, a difference between a position of the upper surface of the first portion of the first insulating layer and a position of the upper surface of the ground layer can be reduced. Thus, a level difference generated due to presence and absence of the ground layer is hardly formed at the upper surface of the second insulating layer formed on the first portion of the first insulating layer and the ground layer. Therefore, the upper wiring trace can be linearly formed on the second insulating layer. Therefore, an increase in line length of the upper wiring trace can be inhibited.

This results in the reduced loss of the electric signal transmitted through the upper wiring trace in a high frequency band.

(2) The upper wiring trace may extend in a first direction, the first insulating layer may have a plurality of the first portions and a plurality of the second portions, and the plurality of the first portions and the plurality of the second portions may be arranged in the first direction to alternate.

In this case, the upper wiring trace overlaps with a plurality of portions of the ground layer intermittently arranged in the first direction. Thus, the uniformity of the characteristic impedance of the upper wiring trace can be improved.

(3) A first opening that overlaps with the first portion of the first insulating layer may be formed in the support substrate, and a second opening that overlaps with the first opening may be formed in the ground layer.

A value of the characteristic impedance of the upper wiring trace is determined according to an area of portions in which the upper wiring trace overlaps with the support substrate and the ground layer. In the above-mentioned configuration, the first and second openings are formed in the support substrate and the ground layer. Therefore, it is possible to easily adjust a value of the characteristic impedance of the upper wiring trace by adjusting the size and the number of first and second openings.

(4) A printed circuit board according to another aspect of the present invention includes a support substrate formed of a conductive material, a ground layer that is formed in a first region on the support substrate and has electric conductivity higher than that of the support substrate, a first insulating layer formed in a second region different from the first region on the support substrate, a second insulating layer formed on the ground layer and the first insulating layer, and an upper wiring trace formed on the second insulating layer to overlap with the first and second regions of the support substrate.

In the printed circuit board, the ground layer is formed on the first region of the support substrate, and the first insulating layer is formed on the second region of the support substrate. Further, the second insulating layer is formed on the ground layer and the first insulating layer. Further, the upper wiring trace is formed on the second insulating layer to overlap with the first and second regions of the first insulating layer. In this case, an electric signal can be transmitted through the upper wiring trace.

In the above-mentioned configuration, the ground layer is positioned between at least part of the upper wiring trace and the support substrate, so that electromagnetic waves radiated from the upper wiring trace towards the support substrate at least partially enter the ground layer and does not reach the support substrate.

Further, in the case where an electric signal having a high frequency band is transmitted through the upper wiring trace, a loss, corresponding to the line length of the upper wiring trace, of the electric signal transmitted through the upper wiring trace is generated. The larger the line length of the upper wiring trace is, the larger the loss of the electric signal is. Further, the smaller the line length of the upper wiring trace is, the smaller the loss of the electric signal is. In the printed circuit board according to the present invention, the ground layer is formed on the first region of the support substrate, and the first insulating layer is formed on the second region of the support substrate. Thus, in the stacking direction of the support substrate, the first insulating layer and the second insulating layer, a difference between a position of the upper surface of the ground layer and a position of the upper surface of the first insulating layer can be reduced. Thus, a level difference generated due to the presence and absence of the ground layer is hardly formed at the upper surface of the second insulating layer that is formed on the ground layer and the first insulating layer. Therefore, the upper wiring trace can be linearly formed on the second insulating layer. Therefore, an increase in line length of the upper wiring trace can be inhibited.

This results in the reduced loss of the electric signal transmitted through the upper wiring trace in a high frequency band.

(5) The upper wiring trace may extend in a first direction, the support substrate may have a plurality of the first regions and has a plurality of the second regions, and the plurality of the first regions and the plurality of the second regions may be arranged in the first direction to alternate.

In this case, the upper wiring trace overlaps with a plurality of portions of the ground layer intermittently arranged in the first direction. Thus, the uniformity of the characteristic impedance of the upper wiring trace can be improved.

(6) A first opening may be formed in at least part of the first region of the support substrate, and a second opening that overlaps with the first opening may be formed in the ground layer.

A value of the characteristic impedance of the upper wiring trace is determined according to an area of portions in which the upper wiring trace overlaps with the support substrate and the ground layer. In the above-mentioned configuration, the first and second openings are formed in the support substrate and the ground layer. Therefore, it is possible to easily adjust a value of the characteristic impedance of the upper wiring trace by adjusting the size and the number of the first and second openings.

(7) The printed circuit board may further include a lower wiring trace formed on the first insulating layer, wherein the second insulating layer may be formed on the first insulating layer to cover the lower wiring trace. In this case, an electric signal can be transmitted through each of the lower wiring trace and the upper wiring trace.

(8) The support substrate may include stainless, and the ground layer may include copper.

In this case, sufficient rigidity of the support substrate required to support the upper wiring trace can be ensured by stainless steel. Further, a passive film is formed on the surface of the stainless steel. Thus, deterioration of the support substrate due to erosion is inhibited. Copper has electric conductivity higher than that of stainless steel. Thus, an eddy current generated in the ground layer by the electromagnetic waves can be reduced.

(9) The printed circuit board may further include a third insulating layer formed on the second insulating layer to cover the upper wiring trace. In this case, the upper wiring trace is protected by the third insulating layer.

(10) A method of manufacturing a printed circuit board according to yet another aspect of the present invention includes the steps of forming a first insulating layer that includes a first portion having a first thickness and a second portion having a second thickness smaller than the first thickness on a support substrate formed of a conductive material, forming a ground layer having electric conductivity higher than that of the support substrate on the second portion of the first insulating layer to be electrically connected to the support substrate, forming a second insulating layer on the first insulating layer to cover the ground layer, and forming an upper wiring trace on the second insulating layer to overlap with the first and second portions of the first insulating layer.

In the printed circuit board acquired by the method of manufacturing, the ground layer is positioned between at least part of the upper wiring trace and the support substrate, so that a large part of the electromagnetic waves radiated from the upper wiring trace towards the support substrate does not reach the support substrate and is shielded by the ground layer. Further, the smaller the line length of the upper wiring trace is, the smaller the loss of the electric signal transmitted through the upper wiring trace is. In the abovementioned configuration, a difference between a position of the upper surface of the first insulating layer and a position of the upper surface of the ground layer in the stacking direction can be reduced. Thus, a level difference generated due to the presence and absence of the ground layer is hardly formed at the upper surface of the second insulating layer. Therefore, the upper wiring trace can be linearly formed, so that an increase in line length of the upper wiring trace is inhibited. This results in the reduced loss of the electric signal transmitted through the upper wiring trace in a high frequency band.

(11) A method of manufacturing a printed circuit board according to yet another aspect of the present invention includes the steps of forming a ground layer having electric conductivity higher than that of the support substrate in a first region on a support substrate formed of a conductive material, forming a first insulating layer in a second region different from the first region on the support substrate, forming a second insulating layer on the ground layer and the first insulating layer, and forming an upper wiring trace on the second insulating layer to overlap with the first and second regions of the support substrate.

In the printed circuit board acquired by the method of manufacturing, the ground layer is positioned between at least part of the upper wiring trace and the support substrate, so that a large part of the electromagnetic waves radiated from the upper wiring trace towards the support substrate does not reach the support substrate and is shielded by the ground layer. Further, the smaller the line length of the upper wiring trace is, the smaller the loss of the electric signal transmitted through the upper wiring trace is. In the abovementioned configuration, a difference between a position of the upper surface of the first insulating layer and a position of the upper surface of the ground layer in the stacking direction can be reduced. Thus, a level difference generated due to the absence and presence of the ground layer is hardly formed at the upper surface of the second insulating layer. Therefore, the upper wiring trace can be linearly formed, so that an increase in line length of the upper wiring trace can be inhibited. This results in the reduced loss of the electric signal transmitted through the upper wiring trace in a high frequency band.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 2A is an enlarged plan view of a portion surrounded by a one-dot and dash line of the suspension board of FIG. 1;

FIG. 2B is a cross sectional view taken along the line A1-A1 of FIG. 2A;

FIG. 2C is a cross sectional view taken along the line B1-B1 of FIG. 2A;

FIG. 4A is a partially enlarged plan view of a suspension board according to a reference embodiment;

FIG. 4B is a cross sectional view taken along the line A0-A0 of FIG. 4A;

FIG. 4C is a cross sectional view taken along the line B0-B0 of FIG. 4A;

FIG. 12A is a partially enlarged plan view of a suspension board according to a second embodiment;

FIG. 12B is a cross sectional view taken along the line A2-A2 of FIG. 12A;

FIG. 12C is a cross sectional view taken along the line B2-B2 of FIG. 12A;

FIG. 20A is a partially enlarged plan view of a suspension board according to a third embodiment;

FIG. 20B is a cross sectional view taken along the line A3-A3 of FIG. 20A;

FIG. 20C is a cross sectional view taken along the line B3-B3 of FIG. 20A;

FIG. 24A is a plan view of a suspension board according to a comparative example;

FIG. 24B is a cross sectional view taken along the line E0-E0 of FIG. 24A;

DESCRIPTION OF THE PREFERRED EMBODIMENTS

A printed circuit board and a method of manufacturing the printed circuit board according to one embodiment of the present invention will be described below with reference to drawings. A suspension board having a circuit (hereinafter abbreviated as a suspension board) used for an actuator of a hard disc drive device will be described as the printed circuit board according to the one embodiment of the present invention.

[1] First Embodiment (1) Structure of Suspension Board

Figure 1:
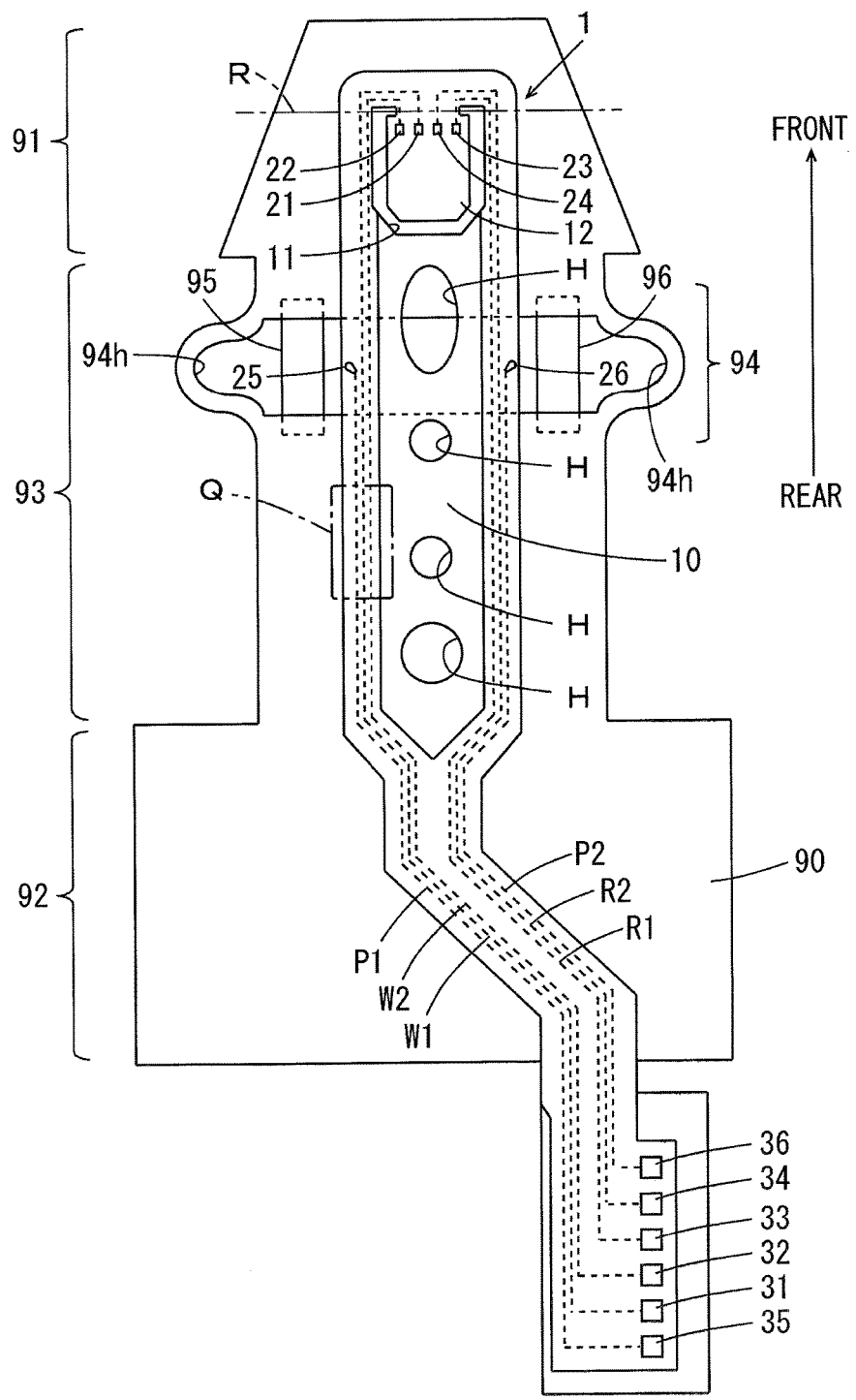
FIG. 1 is a plan view of a suspension board according to a first embodiment.

FIG. 1 is a plan view of the suspension board according to the first embodiment. In FIG. 1, a direction in which an arrow is directed is referred to as forward, and the opposite direction is referred to as rearward. As shown in FIG. 1, the suspension board 1 includes a support substrate 10 made of stainless steel, for example, as a suspension main body. In FIG. 1, the support substrate 10 extends in a substantially front-and-rear direction.

The suspension board 1 is supported by an elongated support plate 90. As indicated by dotted lines in FIG. 1, write wiring traces W1, W2, read wiring traces R1, R2 and power wiring traces P1, P2 are formed on the suspension board 1. Each of the write wiring traces W1, W2 and the read wiring traces R1, R2 is a high frequency line for allowing an electric signal having a high frequency band to be transmitted therethrough. Each of the power wiring traces P1, P2 is a low frequency line for allowing an electric signal, having a frequency band lower than that of the electric signal transmitted through each of the write wiring traces W1, W2 and the read wiring traces R1, R2, to be transmitted therethrough.

At a tip end of the support substrate 10, a magnetic head supporting portion (hereinafter referred to as a tongue) 12 is provided by forming a U-shaped opening 11. The tongue 12 is bent along a one-dot and dash line R to form a predetermined angle with the support substrate 10.

Four connection terminals 21, 22, 23, 24 are formed on an upper surface of the tongue 12 at one end of the support substrate 10. Further, two connection terminals 25, 26 are respectively formed on both sides in the vicinity of a center portion of the support substrate 10 in a direction in which the support substrate 10 extends (the front-and-rear direction). A head slider (not shown) having a magnetic head is mounted on the upper surface of the tongue 12. Terminals of the magnetic head of the head slider are connected to the connection terminals 21 to 24 of the tongue 12.

Six connection terminals 31, 32, 33, 34, 35, 36 are formed on an upper surface at the other end of the support substrate 10. Electric circuits such as a preamplifier are connected to the connection terminals 31 to 34. Power circuits for piezoelectric elements 95, 96, described below, are connected to the connection terminals 35, 36. The connection terminals 21 to 26 are respectively electrically connected to the connection terminals 31 to 36 by the write wiring traces W1, W2, the read wiring traces R1, R2 and the power wiring traces P1, P2. Further, a plurality of holes H are formed in the center portion of the support substrate 10.

The support plate 90 has a front end region 91, a rear end region 92 and a center region 93. The rear end region 92 is rectangular. The front end region 91 is trapezoidal, and its width is gradually reduced forward. The center region 93 has a rectangular shape extending in the front-and-rear direction, and is arranged between the front end region 91 and the rear end region 92. With the suspension board 1 supported by an upper surface of the support plate 90, an end portion of the suspension board 1 including the connection terminals 31 to 36 projects rearward from the rear end region 92.

A piezoelectric element mounting region 94 is provided in one portion of the center region 93. The piezoelectric element mounting region 94 overlaps with the connection terminals 25, 26 of the suspension board 1. Both of side portions of the piezoelectric element mounting region 94 project to be curved outward. Further, a through hole 94h extending in a width direction (a direction orthogonal to the front-and-rear direction) is formed in the piezoelectric element mounting region 94. In this configuration, the piezoelectric element mounting region 94 of the support plate 90 is stretchable in the front-and-rear direction.

The piezoelectric elements 95, 96 are mounted on a lower surface of the piezoelectric element mounting region 94 so as to cross the through hole 94h. The piezoelectric elements 95, 96 are respectively positioned on both sides of the suspension board 1. The piezoelectric elements 95, 96 are respectively connected to the connection terminals 25, 26 of the suspension board 1 through the through hole 94h.

A voltage is added to the piezoelectric element 95 through the connection terminals 25, 35 and the power wiring trace P1, and a voltage is added to the piezoelectric element 96 through the connection terminals 26, 36 and the power wiring trace P2. Thus, with a stretch of the piezoelectric elements 95, 96, the support plate 90 is stretched in the front-and-rear direction. It is possible to subtly position the magnetic head of the head slider on the suspension board 1 by controlling the voltages added to the piezoelectric elements 95, 96.

The suspension board 1 supported by the support plate 90 is provided in the hard disc device. An electric current flows in the pair of write wiring traces W1, W2 at a time of writing the information in a magnetic disc. The write wiring trace W1 and the write wiring trace W2 constitute a differential signal line pair through which differential write signals are transmitted. Further, an electric current flows in the pair of read wiring traces R1, R2 at a time of reading the information from the magnetic disc. The read wiring trace R1 and the read wiring trace R2 constitute a differential signal line pair through which differential read signals are transmitted.

(2) Write Wiring Traces and Power Wiring Trace

Figure 3A:
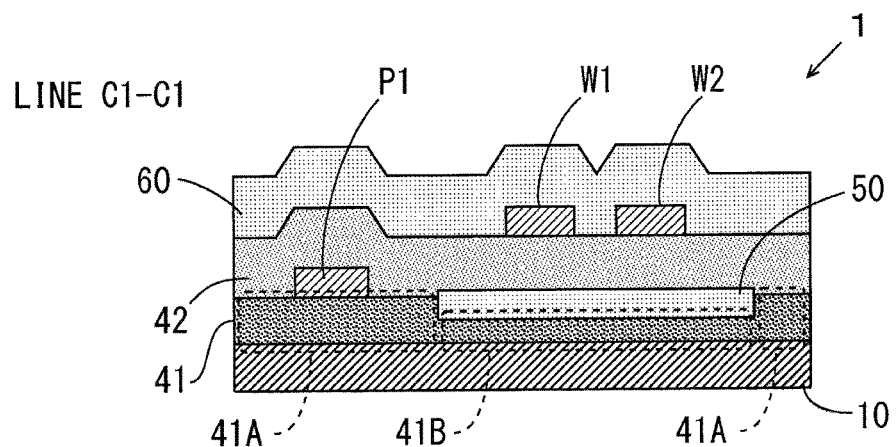
FIG. 3A is a cross sectional view taken along the line C1-C1 of FIG. 2A.
Figure 3B:
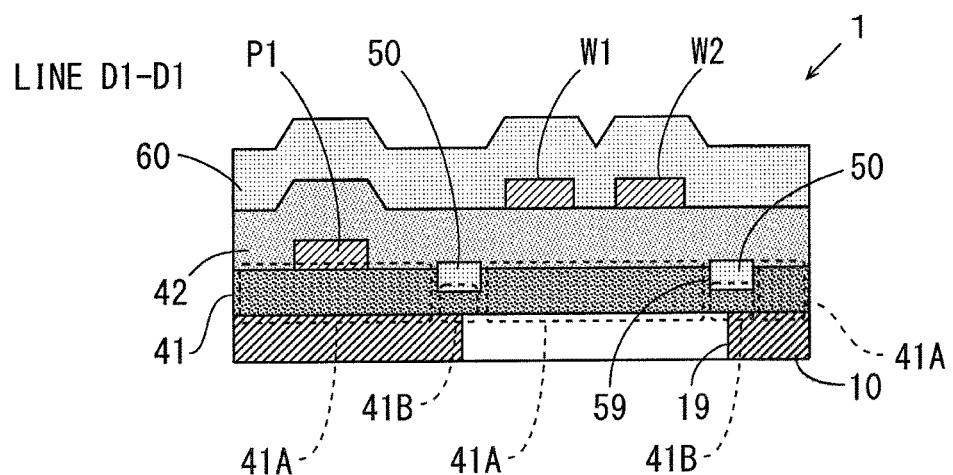
FIG. 3B is a cross sectional view taken along the line D1-D1 of FIG. 2A.

FIG. 2A is an enlarged plan view of a portion Q surrounded by a one-dot and dash line of the suspension board 1 of FIG. 1, FIG. 2B is a cross sectional view taken along the line A1-A1 of FIG. 2A and FIG. 2C is a cross sectional view taken along the line B1-B1 of FIG. 2A. Further, FIG. 3A is a cross sectional view taken along the line C1-C1 of FIG. 2A, and FIG. 3B is a cross sectional view taken along the line D1-D1 of FIG. 2A. As shown in FIG. 2A, in the portion Q of FIG. 1, the write wiring traces W1, W2 and the power wiring trace P1 respectively extend in the front-and-rear direction. Further, the write wiring traces W1, W2 and the power wiring trace P1 are arranged in a direction orthogonal to the front-and-rear direction.

As shown in FIGS. 3A and 3B, a first insulating layer 41 made of polyimide, for example, is formed on the support substrate 10. The support substrate 10 has conductivity and is made of stainless steel, for example. The first insulating layer 41 includes a first portion 41A and a second portion 41B. The second portion 41B has a thickness smaller than that of the first portion 41A.

A ground layer 50 having electric conductivity higher than that of the support substrate 10 is formed on the second portion 41B of the first insulating layer 41. The ground layer 50 is electrically connected to the support substrate 10. The electric connection between the ground layer 50 and the support substrate 10 is realized by a via, wiring or the like formed in the first insulating layer 41, for example.

As a material for the ground layer 50, copper is used, for example. In the case where the support substrate 10 is made of stainless steel as described above, gold or silver may be used as the material for the ground layer 50. Alternatively, an alloy that includes any of gold, silver and copper and has electric conductivity higher than that of the stainless steel may be used as the material for the ground layer 50. The ground layer 50 may have a multilayer structure. For example, in the case where the support substrate 10 is made of stainless steel, the ground layer 50 may have a two-layer structure in which a nickel layer or a silver layer is stacked on a copper layer or a three-layer structure in which a nickel layer and a gold layer are stacked on a copper layer. In the case where the ground layer 50 has the multilayer structure including a copper layer, another metal layer such as a nickel layer, a silver layer, a gold layer or the like may be formed on an upper surface and a side surface of the copper layer to cover the surfaces of the copper layer.

The power wiring trace P1 is formed on the first portion 41A of the first insulating layer 41. As a material for the power wiring trace P1, copper is used, for example. The surface of the power wiring trace P1 may be covered by a nickel layer, a silver layer or the like.

A second insulating layer 42 made of polyimide, for example, is formed on the first insulating layer 41 to cover the ground layer 50 and the power wiring trace P1.

As shown in FIG. 2B, on the support substrate 10 taken along the line A1-A1 of FIG. 2A, a plurality of first portions 41A and a plurality of second portions 41B of the first insulating layer 41 are arranged to alternate. The write wiring trace W1 is formed on the second insulating layer 42 to overlap with the plurality of first portions 41A and the plurality of second portions 41B of the first insulating layer 41. Similarly to the write wiring trace W1, the write wiring trace W2 is formed on the second insulating layer 42 to overlap with the plurality of first portions 41A and the plurality of second portions 41B of the first insulating layer 41.

In the present example, the ground layer 50 is formed on the second portion 41B of the first insulating layer 41. Thus, a portion of each of the write wiring traces W1, W2 that overlaps with the second portion 41B of the first insulating layer 41 also overlaps with the ground layer 50.

As a material for the write wiring traces W1, W2, copper is used, for example. Surfaces of the write wiring traces W1, W2 may be covered by a nickel layer, a silver layer or the like. A third insulating layer 60 made of polyimide, for example, is formed on the second insulating layer 42 to cover the write wiring traces W1, W2.

In FIG. 2A, the first insulating layer 41, the second insulating layer 42 and the third insulating layer 60 of FIGS. 2B, 2C, 3A and 3B are not shown. Further, in FIG. 2A, the write wiring traces W1, W2 are indicated by thick solid lines and hatching, the power wiring trace P1 is indicated by a thick one-dot and dash line and hatching, and the ground layer 50 is indicated by a solid line and a dotted pattern. Further, the support substrate 10 is indicated by a two-dots and dash line.

In the case where an electric signal having a high frequency band is transmitted through each of the write wiring traces W1, W2, electromagnetic waves are generated from each of the write wiring traces W1, W2. When the generated electromagnetic waves enter the support substrate 10 or the ground layer 50, an eddy current is generated in the support substrate 10, and each of the write wiring traces W1, W2 is electromagnetically coupled to the support substrate 10 or the ground layer 50. The loss, corresponding to the magnitude of the eddy current generated in the support substrate 10 or the ground layer 50, of the electric signal transmitted through each of the write wiring traces W1, W2 is generated. The larger the generated eddy current is, the larger the loss of the electric signal is. Further, the smaller the generated eddy current is, the smaller the loss of the electric signal is.

As for an eddy current generated in a conductor when electromagnetic waves are supplied to the conductor, the lower the electric conductivity of the conductor is, the larger the eddy current is. Further, the higher the electric conductivity of the conductor is, the smaller the eddy current is. The ground layer 50 has the electric conductivity higher than that of the support substrate 10. Therefore, an eddy current generated in the ground layer 50 by electromagnetic waves is smaller than an eddy current generated in the support substrate 10 by electromagnetic waves.

In the above-mentioned configuration, because the ground layer 50 is positioned between at least part of each of the write wiring traces W1, W2 and the support substrate 10, electromagnetic waves radiated from each of the write wiring traces W1, W2 towards the support substrate 10 at least partially enter the ground layer 50 and do not reach the support substrate 10. This reduces a loss of an electric signal transmitted through each of the write wiring traces W1, W2 in a high frequency band.

A value of characteristic impedance of each of the write wiring traces W1, W2 is determined according to an area of portions in which each of the write wiring traces W1, W2 overlaps with the support substrate 10 and the ground layer 50. For example, as compared to the case where the write wiring trace W1 partially overlaps with the support substrate 10 and the ground layer 50, the value of characteristic impedance of the write wiring trace W1 is larger in the case where the entire write wiring trace W1 overlaps with the support substrate 10 and the ground layer 50. Further, as compared to the case where the write wiring trace W1 does not overlap with the support substrate 10 and the ground layer 50, the value of characteristic impedance is larger in the case where the write wiring trace W1 partially overlaps with the support substrate 10 and the ground layer 50.

Then, in the present embodiment, the area in which each of the write wiring traces W1, W2 overlaps with the support substrate 10 and the ground layer 50 is adjusted such that the value of characteristic impedance of each of the write wiring traces W1, W2 is closer to a desired value. Specifically, as shown in FIGS. 2A, 2B and 3B, a plurality of first openings 19 that overlap with each of the write wiring traces W1, W2 are formed in the support substrate 10 according to the preset impedance. Further, a plurality of second openings 59 that respectively overlap with the plurality of first openings 19 are formed in the ground layer 50.

The plurality of first openings 19 and the plurality of second openings 59 are intermittently formed to basically be arranged in a direction in which each of the write wiring traces W1, W2 extends. Thus, the uniformity of the characteristic impedance of each of the write wiring traces W1, W2 can be improved. The plurality of first openings 19 do not have to be formed in the support substrate 10 depending on the set impedance.

In the following description, a direction in which the support substrate 10, the first insulating layer 41 and the second insulating layer 42 are stacked is referred to as a substrate stacking direction. As shown in FIG. 2A, each first opening 19 and each second opening 59 that overlap with each other are formed such that, in the case where the suspension board 1 is viewed in the substrate stacking direction, an inner edge of the first opening 19 surrounds an inner edge of the second opening 59. In this configuration, electromagnetic waves radiated from each of the write wiring traces W1, W2 towards the second opening 59 pass through the second opening 59, and then entrance of the electromagnetic waves into the inner edge of the first opening 19 of the support substrate 10 is reduced. This reduces the generation of an eddy current in the support substrate 10.

As shown in FIGS. 3A and 3B, in the above-mentioned suspension board 1, the ground layer 50 is formed on the second portion 41B, having a small thickness, of the first insulating layer 41. In this case, in the substrate stacking direction, a difference between a position (height) of an upper surface of the ground layer 50 and a position (height) of an upper surface of the first portion 41A of the first insulating layer 41 is small. Thus, a level difference generated due to absence and presence of the ground layer 50 is hardly formed at the upper surface of the second insulating layer 42. Thus, as shown in FIG. 2B, the write wiring traces W1, W2 are linearly formed on the almost flat upper surface of the second insulating layer 42.

Figure 5A:
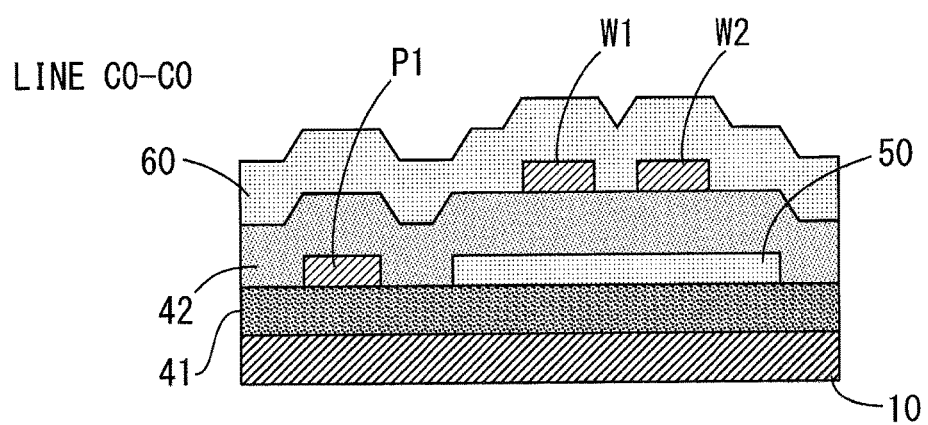
FIG. 5A is a cross sectional view taken along the line C0-C0 of FIG. 4A.
Figure 5B:
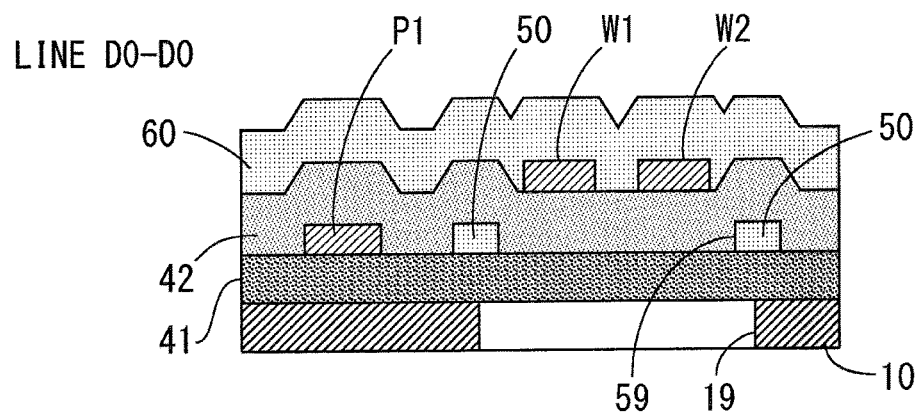
FIG. 5B is a cross sectional view taken along the line D0-D0 of FIG. 4A.

As for a suspension board according to a reference embodiment, differences from the suspension board 1 of FIG. 1 will be described. FIG. 4A is a partially enlarged plan view of the suspension board according to the reference embodiment, FIG. 4B is a cross sectional view taken along the line A0-A0 of FIG. 4A, and FIG. 4C is a cross sectional view taken along the line B0-B0 of FIG. 4A. Further, FIG. 5A is a cross sectional view taken along the line C0-C0 of FIG. 4A, and FIG. 5B is a cross sectional view taken along the line D0-D0 of FIG. 4A. The plan view of FIG. 4A and the cross sectional views of FIGS. 4B, 4C, 5A and 5B correspond to the plan view of FIG. 2A and the cross sectional views of FIGS. 2B, 2C, 3A and 3B.

In the suspension board according to the reference embodiment, as shown in FIGS. 4B, 4C, 5A and 5B, a first insulating layer 41 formed on a support substrate 10 has a constant thickness. A ground layer 50 is formed on an upper surface of the first insulating layer 41 together with a power wiring trace P1. In this case, in the substrate stacking direction, a difference, which is the same as the thickness of the ground layer 50, is generated between a position (height) of an upper surface of the ground layer 50 and a position (height) of an upper surface of the first insulating layer 41. Thus, level differences generated due to the presence and absence of the ground layer 50 are formed at an upper surface of a second insulating layer 42. Therefore, as shown in FIG. 4B, write wiring traces W1, W2 are formed in a waveform on the upper surface of the second insulating layer 42 to go over the plurality of level differences.

In the case where an electric signal having a high frequency band is transmitted through each of the write wiring traces W1, W2, a loss, corresponding to a line length of each of the write wiring traces W1, W2, of the electric signal transmitted through each of the write wiring traces W1, W2 is generated. The larger the line length of each of the write wiring traces W1, W2 is, the larger a loss of an electric signal is. Further, the smaller the line length of each of the write wiring traces W1, W2 is, the smaller a loss of an electric signal is. As described above, in the suspension board according to the reference embodiment, the write wiring traces W1, W2 are formed in a waveform. In contrast, in the suspension board 1 according to the present embodiment, the write wiring traces W1, W2 are almost linearly formed. Thus, the line length of each of the write wiring traces W1, W2 according to the present embodiment is smaller than that of each of the waveform write wiring traces W1, W2 (FIG. 4B). In this manner, an increase in line length of each of the write wiring traces W1, W2 can be inhibited, so that a loss of an electric signal transmitted through each of the write wiring traces W1, W2 in a high frequency band is reduced. In the present embodiment, the line length means a length of a line passing through a central axis of a transmission line.

The configuration of each of the read wiring traces R1, R2, the power wiring trace P2 of FIG. 1 and their vicinities is basically similar to that of each of the write wiring traces W1 W2, the power wiring trace P1 and their vicinities of FIGS. 2A, 2B, 2C, 3A and 3B.

(3) Method of Manufacturing Suspension Board

The method of manufacturing the suspension board 1 will be described. FIGS. 6A to 11B are schematic cross sectional views for illustrating steps in the method of manufacturing the suspension board 1 of FIG. 1. In diagrams of FIGS. 6A to 11B, each of FIGS. 6A, 7A, 8A, 9A, 10A and 11A corresponds to a cross sectional view taken along the line C1-C1 of FIG. 2A, and each of FIGS. 6B, 7B, 8B, 9B, 10B and 11B corresponds to a cross sectional view taken along the line D1-D1 of FIG. 2A. The steps of forming the tongue 12, the plurality of connection terminals 21 to 26, 31 to 36, the plurality of holes H, the read wiring traces R1, R2 and the power wiring trace P2 of FIG. 1 will not be described.

Figure 6A:
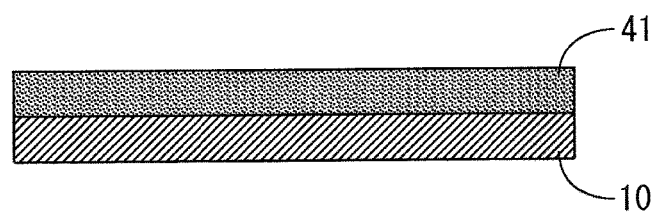
FIGS. 6A and 6B are schematic cross sectional views illustrating steps in a method of manufacturing the suspension board of FIG. 1.
Figure 6B:
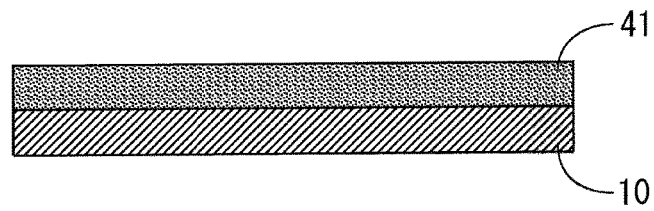

First, an elongated substrate made of stainless steel is prepared as the support substrate 10. Subsequently, as shown in FIGS. 6A and 6B, the first insulating layer 41 made of polyimide is formed on the support substrate 10. The thickness of the support substrate 10 is not less than 8 μm and not more than 100 μm, for example. The thickness of the first insulating layer 41 is not less than 1 μm and not more than 25 μm, for example.

Figure 7A:
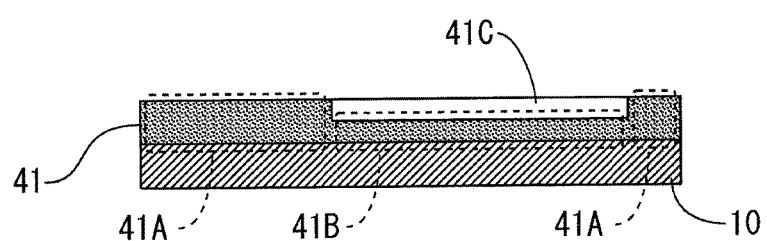
FIGS. 7A and 7B are schematic cross sectional views illustrating the steps in the method of manufacturing the suspension board of FIG. 1.
Figure 7B:
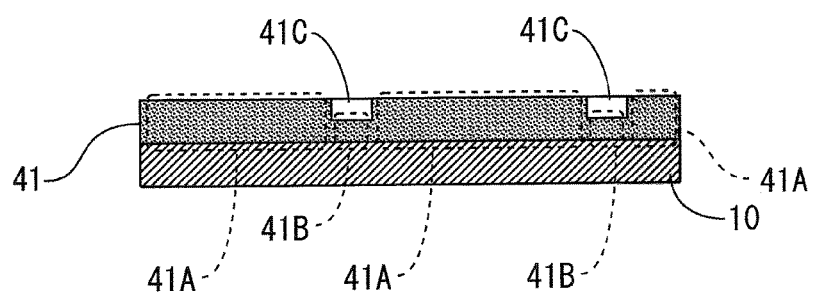

Next, as shown in FIGS. 7A and 7B, a recess portion 41C is formed in a predetermined region of the upper surface of the first insulating layer 41. The depth of the recess portion 41C is not less than 1 μm and not more than 24 μm, for example. A portion in which the recess portion 41C is not formed of the first insulating layer 41 is the above-mentioned first portion 41A, and a portion in which the recess portion 41C is formed of the first insulating layer 41 is the above-mentioned second portion 41B.

The recess portion 41C is formed by a gradation exposure technique when the first insulating layer 41 is formed, for example. Alternatively, the recess portion 41C may be formed by etching of part of the first insulating layer 41 that is formed to have a constant thickness, or may be formed by laser processing of part of the first insulating layer 41 that is formed to have the constant thickness.

Figure 8A:
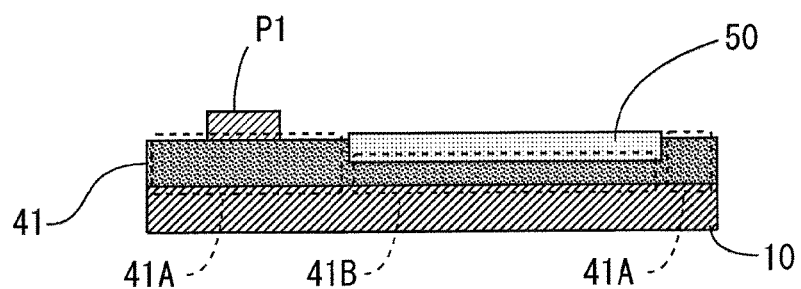
FIGS. 8A and 8B are schematic cross sectional views illustrating the steps in the method of manufacturing the suspension board of FIG. 1.
Figure 8B:
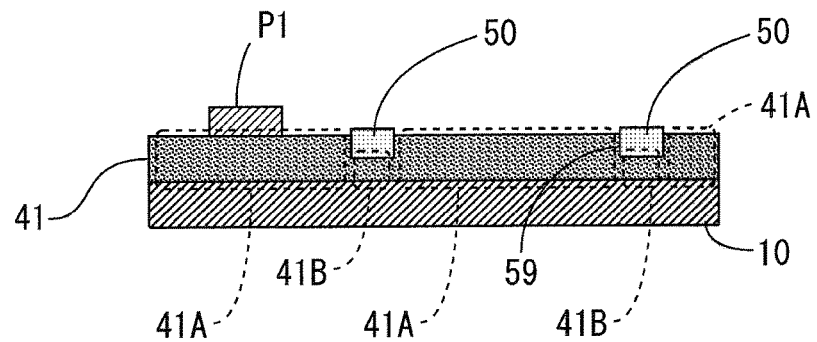

Next, as shown in FIGS. 8A and 8B, the ground layer 50 made of copper is formed on the second portion 41B of the first insulating layer 41. Further, the power wiring trace P1 made of copper is formed on a predetermined region of the first portion 41A simultaneously with the formation of the ground layer 50. At this time, as shown in FIG. 8B, the plurality of second openings 59 of FIG. 2A are formed in the ground layer 50. The thickness of each of the ground layer 50 and the power wiring trace P1 is not less than 1 μm and not more than 20 μm, for example.

When the ground layer 50 is formed, the ground layer 50 and the support substrate 10 may be electrically connected to each other by formation of a via or the like (not shown) in the first insulating layer 41, for example.

Figure 9A:
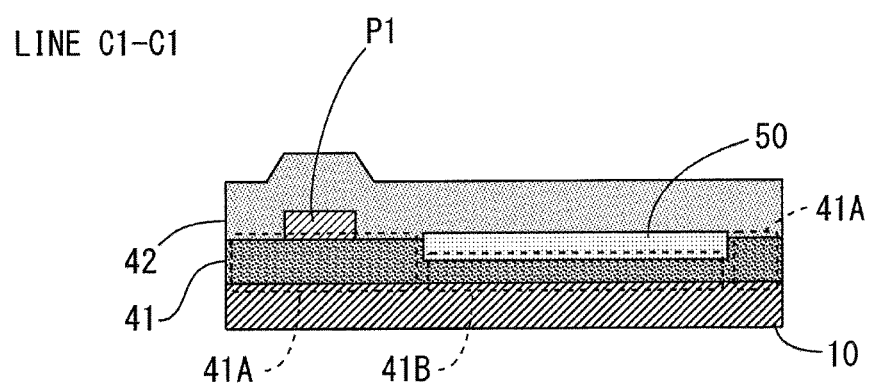
FIGS. 9A and 9B are schematic cross sectional views illustrating the steps in the method of manufacturing the suspension board of FIG. 1.
Figure 9B:
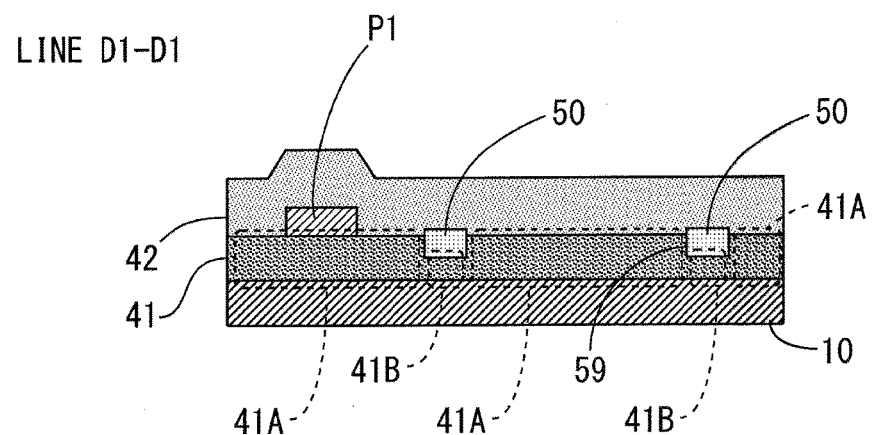

Then, as shown in FIGS. 9A and 9B, the second insulating layer 42 made of polyimide is formed on the first insulating layer 41 to cover the ground layer 50 and the power wiring trace P1. The thickness of the second insulating layer 42 is not less than 1 μm and not more than 25 μm, for example.

Figure 10A:
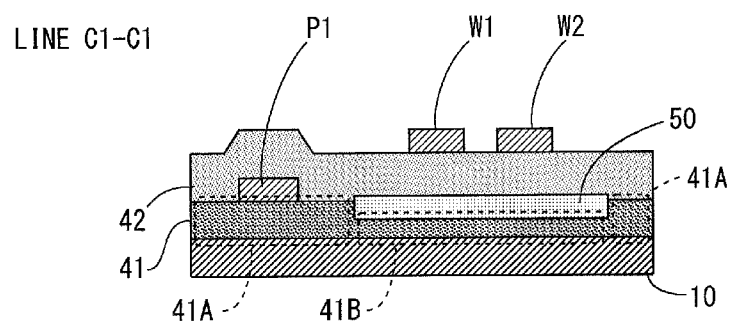
FIGS. 10A and 10B are schematic cross sectional views illustrating the steps in the method of manufacturing the suspension board of FIG. 1.
Figure 10B:
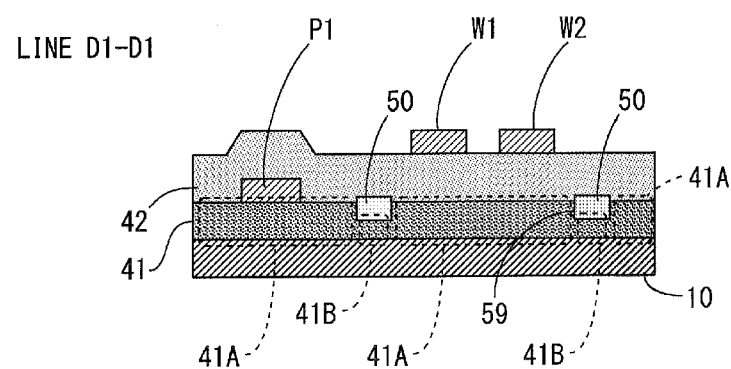

Next, as shown in FIGS. 10A and 10B, the write wiring traces W1, W2 made of copper are formed on the second insulating layer 42 to overlap with the first portion 41A and the second portion 41B of the first insulating layer 41.

The thickness of the write wiring traces W1, W2 is not less than 1 μm and not more than 20 μm, for example. The width of the write wiring traces W1, W2 is not less than 6 μm and not more than 100 μm, for example. Further, a distance between the write wiring traces W1, W2 is not less than 6 μm and not more than 100 μm, for example.

Figure 11A:
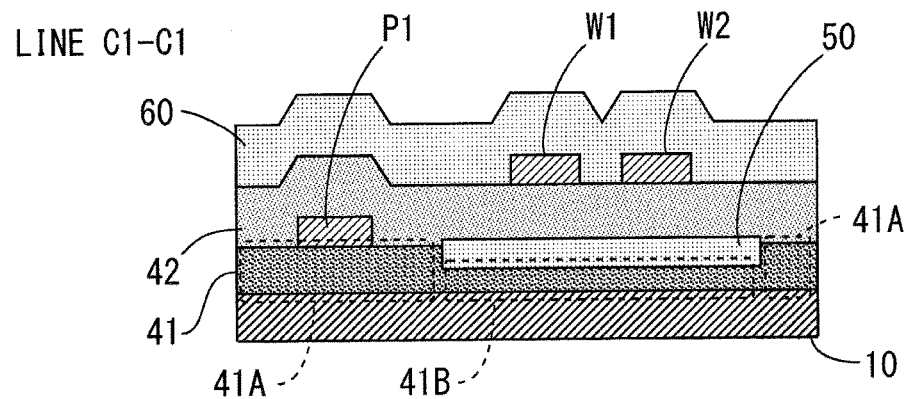
FIGS. 11A and 11B are schematic cross sectional views illustrating the steps in the method of manufacturing the suspension board of FIG. 1.
Figure 11B:
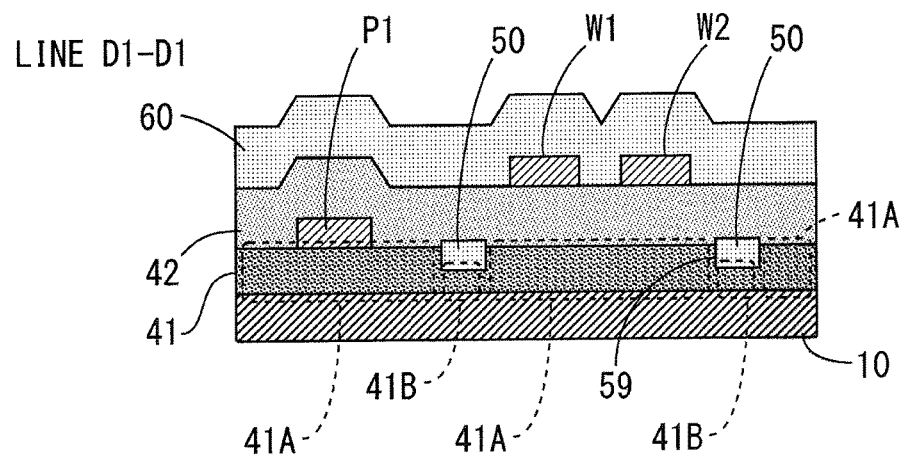

Then, as shown in FIGS. 11A and 11B, the third insulating layer 60 made of polyimide is formed on the second insulating layer 42 to cover the write wiring traces W1, W2. The third insulating layer 60 is used to protect the write wiring traces W1, W2. The thickness of the third insulating layer 60 is not less than 2 μm and not more than 25 μm, for example.

Finally, an outer edge of the support substrate 10 is processed according to a design dimension, and the plurality of first openings 19 are formed in a plurality of predetermined portions of the support substrate 10. Thus, the suspension board 1 having the configuration of FIGS. 3A and 3B is completed.

(4) Effect

In the suspension board 1 according to the present embodiment, the ground layer 50 is positioned between at least part of each of the write wiring traces W1, W2 and the support substrate 10, electromagnetic waves radiated from each of the write wiring traces W1, W2 towards the support substrate 10 are at least partially shielded by the ground layer 50. This reduces generation of an eddy current in the support substrate 10.

Further, the smaller the line length of each of the write wiring traces W1, W2 is, the smaller a loss of an electric signal transmitted through each of the write wiring traces W1, W2 is. The above-mentioned configuration enables a difference between a position (height) of the upper surface of the ground layer 50 and a position (height) of the upper surface of the first portion 41A of the first insulating layer 41 in the substrate stacking direction to be reduced. Thus, a level difference generated due to the absence and presence of the ground layer 50 is hardly formed at the upper surface of the second insulating layer 42. Therefore, the write wiring traces W1, W2 can be linearly formed, so that an increase in line length of each of the write wiring traces W1, W2 can be inhibited.

This results in the reduced loss of an electric signal transmitted through each of the write wiring traces W1, W2 in a high frequency band.

[2] Second Embodiment

Figure 13A:
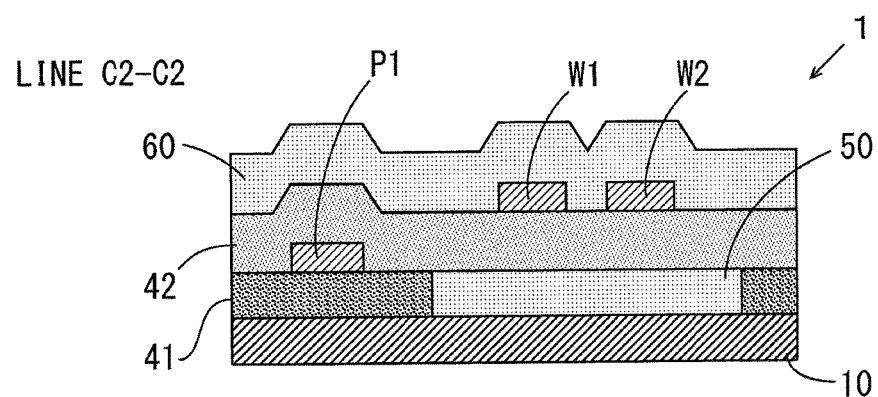
FIG. 13A is a cross sectional view taken along the line C2-C2 of FIG. 12A.
Figure 13B:
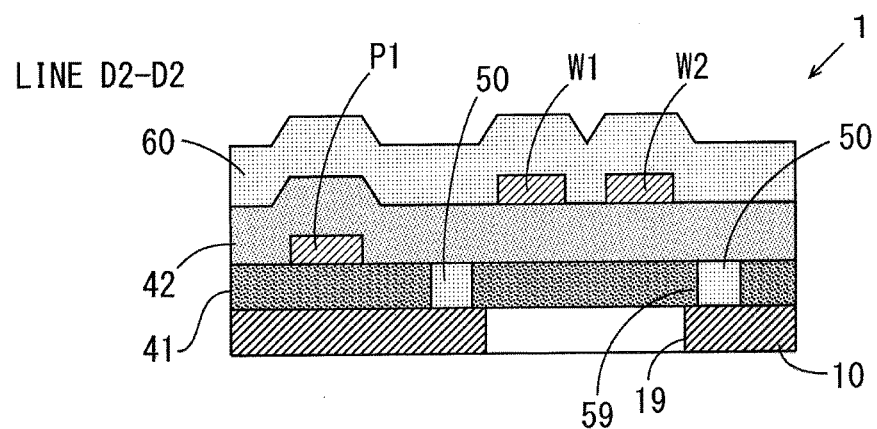
FIG. 13B is a cross sectional view taken along the line D2-D2 of FIG. 12A.

As for a suspension board according to the second embodiment, differences from the suspension board 1 according to the first embodiment will be described. FIG. 12A is a partially enlarged plan view of the suspension board according to the second embodiment, FIG. 12B is a cross sectional view taken along the line A2-A2 of FIG. 12A, and FIG. 12C is a cross sectional view taken along the line B2-B2 of FIG. 12A. Further, FIG. 13A is a cross sectional view taken along the line C2-C2 of FIG. 12A, and FIG. 13B is a cross sectional view taken along the line D2-D2 of FIG. 12A. The plan view of FIG. 12A and the cross sectional views of FIGS. 126, 12C, 13A and 136 correspond to the plan view of FIG. 2A and the cross sectional views of FIGS. 2B, 2C, 3A and 3B. In FIG. 12A, similarly to the example of FIG. 2A, part of constituent elements among a plurality of constituent elements of the suspension board 1 is indicated by different display patterns, and other constituent elements are not shown.

In the suspension board 1 according to the present embodiment, as shown in FIGS. 13A and 13B, a ground layer 50 is formed on a partial region (a first region 10A, described below) of an upper surface of a support substrate 10. Thus, in the partial region of the support substrate 10, the upper surface of the support substrate 10 and a lower surface of the ground layer 50 are in contact with each other. Further, a first insulating layer 41 is formed on a region (a second region 106, described below) in which the ground layer 50 of the support substrate 10 is not formed.

A second insulating layer 42 is formed on each of the ground layer 50 and the first insulating layer 41. Each of write wiring traces W1, W2 is formed on the second insulating layer 42 to overlap with the ground layer 50 and the first insulating layer 41.

Also in the above-mentioned configuration, the ground layer 50 is positioned between at least part of each of the write wiring traces W1, W2 and the support substrate 10, so that electromagnetic waves radiated from each of the write wiring traces W1, W2 towards the support substrate 10 at least partially enter the ground layer 50 and do not reach the support substrate 10. This reduces a loss of an electric signal transmitted through each of the write wiring traces W1, W2 in a high frequency band.

The thickness of the ground layer 50 and the thickness of the first insulating layer 41 are set to be substantially equal to each other. In this case, in the substrate stacking direction, a difference between a position (height) of the upper surface of the ground layer 50 and a position (height) of the upper surface of the first insulating layer 41 is small. Thus, a level difference generated due to absence and presence of the ground layer 50 is hardly formed at an upper surface of a second insulating layer 42. Therefore, similarly to the suspension board according to the first embodiment, the write wiring traces W1, W2 are linearly formed on the almost flat upper surface of the second insulating layer 42. Therefore, an increase in line length of each of the write wiring traces W1, W2 can be inhibited, so that a loss of an electric signal transmitted through each of the write wiring traces W1, W2 in a high frequency band can be reduced.

In the present embodiment, as shown in FIG. 12A, each first opening 19 and each second opening 59 that overlap with each other are formed such that, in the case where the suspension board 1 is viewed in the substrate stacking direction, an inner edge of the second opening 59 surrounds an inner edge of the first opening 19. In this configuration, the inner edge of each second opening 59 of the ground layer 50 is covered by the first insulating layer 41. Thus, the inner edge of each second opening 59 of the ground layer 50 is not exposed between the first insulating layer 41 and the support substrate 10 to the outside of the suspension board 1. Therefore, erosion of the ground layer 50 from the inner edge of each second opening 59 is prevented.

A method of manufacturing the suspension board 1 according to the second embodiment will be described. FIGS. 14A to 19B are cross sectional views illustrating steps in the method of manufacturing the suspension board 1 according to the second embodiment. In diagrams of FIGS. 14A to 19B, each of FIGS. 14A, 15A, 16A, 17A, 18A and 19A corresponds to the cross sectional view taken along the line C2-C2 of FIG. 12A, and each of FIGS. 14B, 15B, 16B, 17B, 18B and 19B corresponds to the cross sectional view taken along the line D2-D2 of FIG. 12A. The step of forming a tongue 12, a plurality of connection terminals 21 to 26, 31 to 36, a plurality of holes H, read wiring traces R1, R2 and a power wiring trace P2 of FIG. 1 will not be described.

Figure 14A:
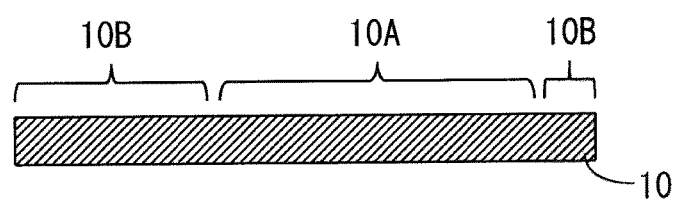
FIGS. 14A and 14B are schematic cross sectional views illustrating steps in a method of manufacturing the suspension board according to the second embodiment.
Figure 14B:
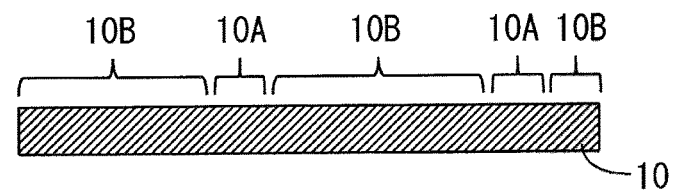

Similarly to the first embodiment, an elongated substrate made of stainless steel is first prepared as the support substrate 10. As shown in FIGS. 14A and 14B, in the present embodiment, the first region 10A in which the ground layer 50 of FIGS. 13A and 13B is to be formed and the second region 10B in which the ground layer 50 is not to be formed are determined in advance on the upper surface of the support substrate 10.

Figure 15A:
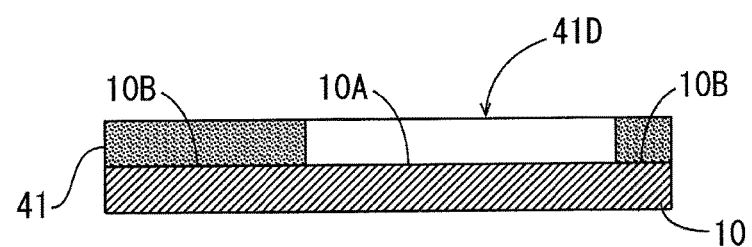
FIGS. 15A and 15B are schematic cross sectional views illustrating the steps in the method of manufacturing the suspension board according to the second embodiment.
Figure 15B:
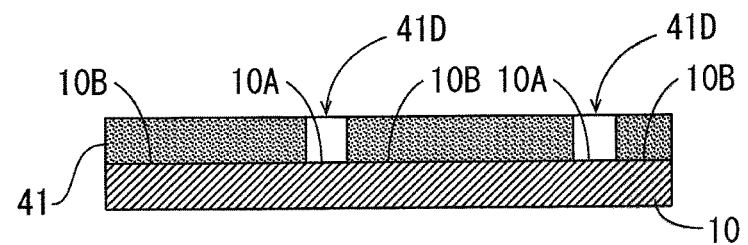

Subsequently, as shown in FIGS. 15A and 15B, the first insulating layer 41 made of polyimide is formed on the support substrate 10, and then an opening 41D is formed such that the first region 10A of the upper surface of the support substrate 10 is exposed upward. The opening 41D is formed by the gradation exposure technique when the first insulating layer 41 is formed, for example. Alternatively, the opening 41D may be formed by etching of part of the first insulating layer 41 or may be formed by laser processing of part of the first insulating layer 41.

Figure 16A:
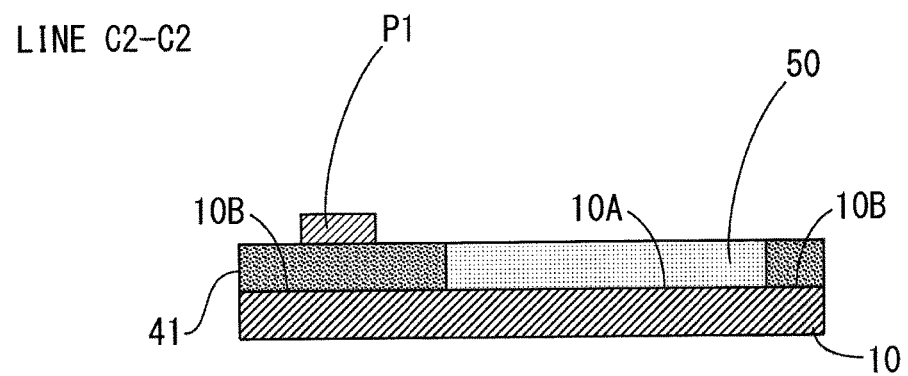
FIGS. 16A and 16B are schematic cross sectional views illustrating the steps in the method of manufacturing the suspension board according to the second embodiment.
Figure 16B:
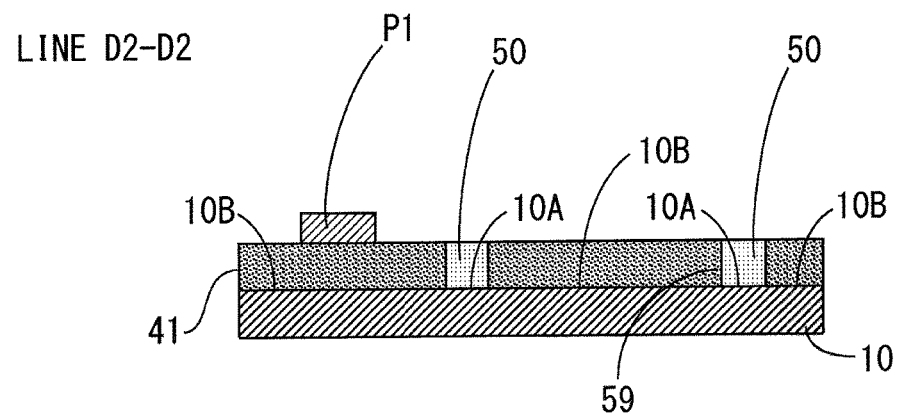

Next, as shown in FIGS. 16A and 16B, the ground layer 50 is formed on the first region 10A of the support substrate 10 exposed upward. Further, a power wiring trace P1 is formed on a predetermined region, which overlaps with the second region 10B of the support substrate 10, of the first insulating layer 41 simultaneously with the formation of the ground layer 50. At this time, as shown in FIG. 16B, the plurality of second openings 59 of FIG. 12A are formed in the ground layer 50.

Figure 17A:
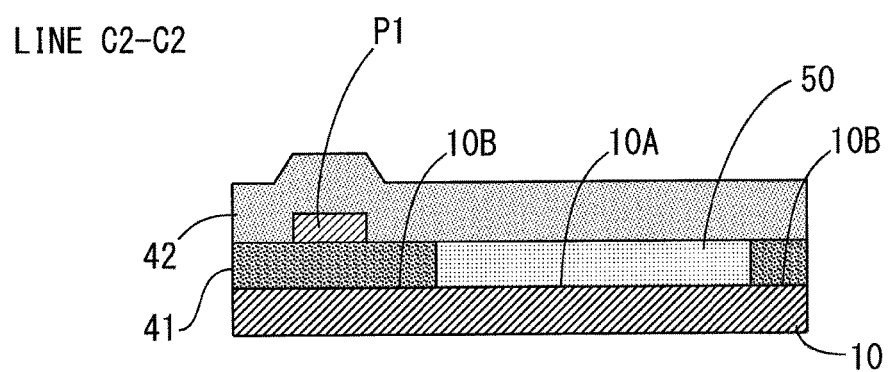
FIGS. 17A and 17B are schematic cross sectional views illustrating the steps in the method of manufacturing the suspension board according to the second embodiment.
Figure 17B:
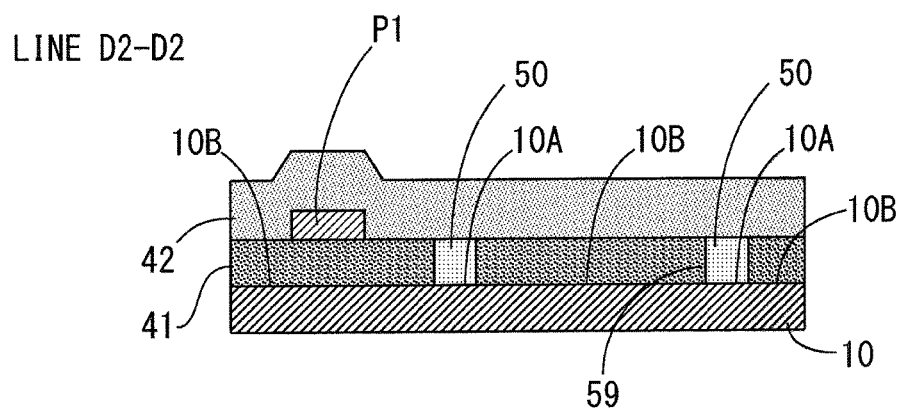

Then, as shown in FIGS. 17A and 17B, the second insulating layer 42 made of polyimide is formed on each of the ground layer 50 and the first insulating layer 41 to cover the power wiring trace P1.

Figure 18A:
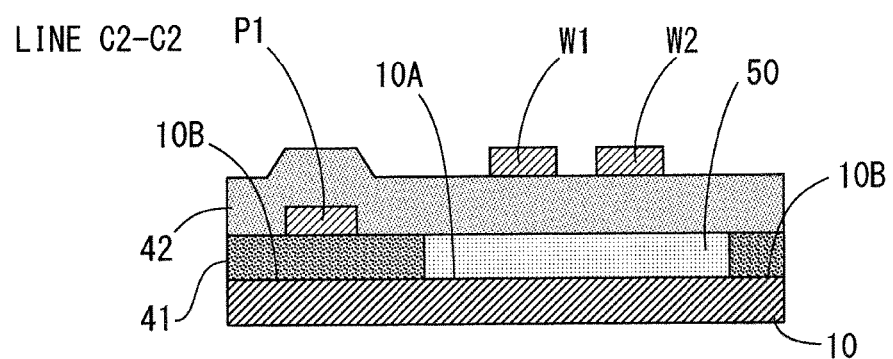
FIGS. 18A and 18B are schematic cross sectional views illustrating the steps in the method of manufacturing the suspension board according to the second embodiment.
Figure 18B:
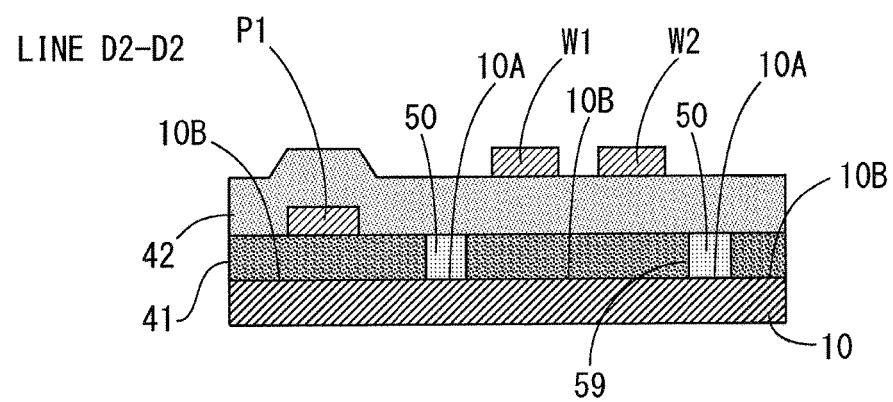

Next, as shown in FIGS. 18A and 18B, the write wiring traces W1, W2 made of copper are formed on the second insulating layer 42 to overlap with the first region 10A and the second region 10B of the support substrate 10.

Figure 19A:
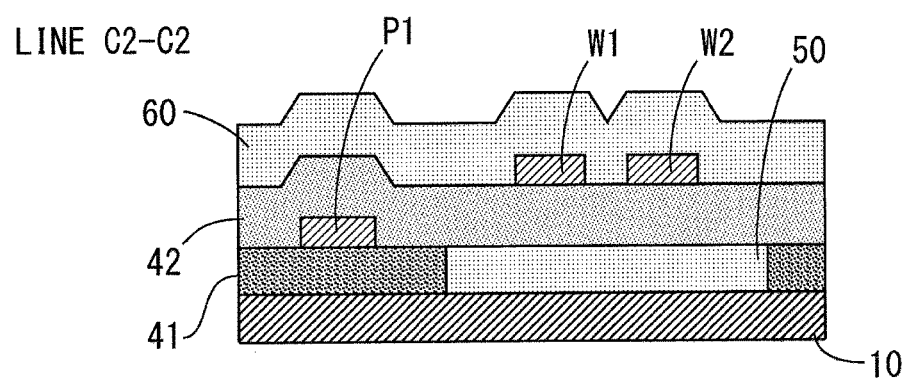
FIGS. 19A and 19B are schematic cross sectional views illustrating the steps in the method of manufacturing the suspension board according to the second embodiment.
Figure 19B:
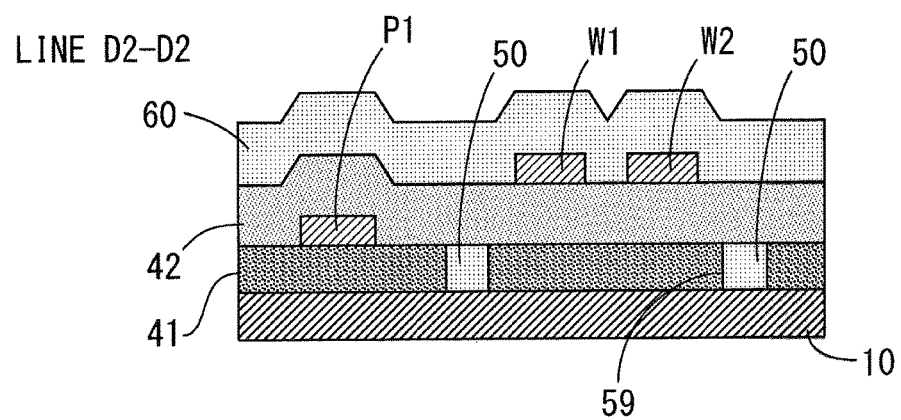

Then, as shown in FIGS. 19A and 19B, a third insulating layer 60 made of polyimide is formed on the second insulating layer 42 to cover the write wiring traces W1, W2.

Finally, an outer edge of the support substrate 10 is processed according to a design dimension, and the plurality of first openings 19 are formed in a plurality of predetermined portions of the support substrate 10. Thus, the suspension board 1 having the structure of FIGS. 13A and 13B is completed.

[3] Third Embodiment

Figure 21A:
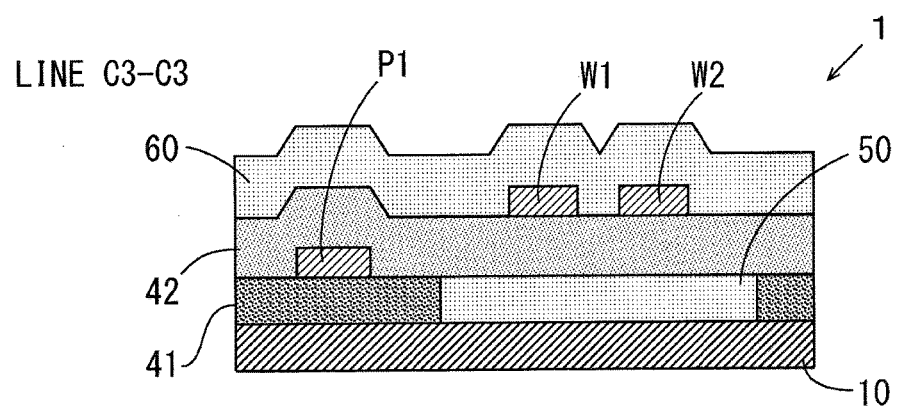
FIG. 21A is a cross sectional view taken along the line C3-C3 of FIG. 20A.
Figure 21B:
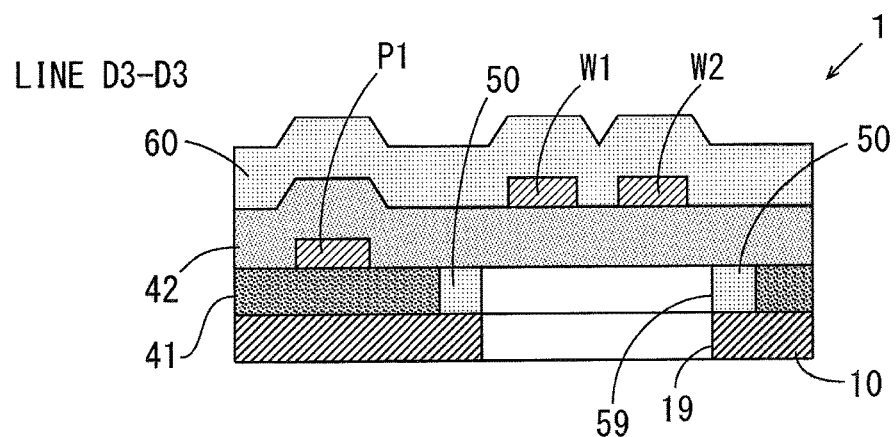
FIG. 21B is a cross sectional view taken along the line D3-D3 of FIG. 20A.

As for a suspension board according to the third embodiment, differences from the suspension board 1 according to the second embodiment will be described. FIG. 20A is a partially enlarged plan view of the suspension board according to the third embodiment, FIG. 20B is a cross sectional view taken along the line A3-A3 of FIG. 20A, and FIG. 20C is a cross sectional view taken along the line B3-B3 of FIG. 20A. Further, FIG. 21A is a cross sectional view taken along the line C3-C3 of FIG. 20A, and FIG. 21B is a cross sectional view taken along the line D3-D3 of FIG. 20A. The plan view of FIG. 20A and the cross sectional views of FIGS. 20B, 20C, 21A and 21B correspond to the plan view of FIG. 12A and the cross sectional views of FIGS. 12B, 12C, 13A and 13B. In FIG. 20A, similarly to the example of FIG. 12A, part of constituent elements among a plurality of constituent elements of the suspension board 1 is indicated by different display patterns, and other constituent elements are not shown.

As shown in FIGS. 20A, 20B and 21B, in the case where the suspension board 1 according to the present embodiment is viewed in the substrate stacking direction, an inner edge of each second opening 59 of a ground layer 50 and an inner edge of each first opening 19 of a support substrate 10 overlap with each other. In this configuration, a material having excellent corrosion resistance such as gold is used as the material for the ground layer 50, so that erosion of the ground layer 50 from the inner edge of each second opening 59 is prevented.

As described above, in the method of manufacturing the suspension board 1 according to the second embodiment, when the ground layer 50 is formed on the support substrate 10, the plurality of second openings 59 are formed (see FIG. 16B). In contrast, in the method of manufacturing the suspension board according to the present embodiment, the plurality of second openings 59 are not formed in the step of forming the ground layer 50 on the support substrate 10. After a step of forming the third insulating layer 60 shown in FIG. 19B, the plurality of first openings 19 are formed, and the plurality of second openings 59 are formed in the ground layer 50, in the step of forming the plurality of first openings 19 in the support substrate 10.

Also in the suspension board according to the present embodiment, in the substrate stacking direction, a difference between a position (height) of an upper surface of the ground layer 50 and a position (height) of an upper surface of a first portion 41A of a first insulating layer 41 is small. Thus, a level difference generated due to absence and presence of the ground layer 50 is hardly formed at an upper surface of a second insulating layer 42. Therefore, similarly to the suspension board 1 according to the second embodiment, write wiring traces W1, W2 are linearly formed on the almost flat upper surface of the second insulating layer 42. Therefore, an increase in line length of each of the write wiring traces W1, W2 can be inhibited.

[4] Another Embodiment

While each of the power wiring traces P1, P2 is a low frequency line for allowing an electric signal having a low frequency band to be transmitted therethrough in the above-mentioned embodiment, the present invention is not limited to this. In the case where a loss of an electric signal transmitted through each of power wiring traces P1, P2 is allowed to a certain degree, an electric signal having a high frequency band may be transmitted through each of the power wiring traces P1, P2. That is, the power wiring traces P1, P2 may be used as high frequency lines.

[5] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the present embodiment, the support substrate 10 is an example of a support substrate, the first portion 41A is an example of a first portion, the second portion 41B is an example of a second portion, the first insulating layer 41 is an example of a first insulating layer, the ground layer 50 is an example of a ground layer, the second insulating layer 42 is an example of a second insulating layer, the write wiring traces W1, W2 are examples of an upper wiring trace, and the suspension board 1 is an example of a printed circuit board.

Further, the first opening 19 is an example of a first opening, the second opening 59 is an example of a second opening, the first region 10A is an example of a first region, the second region 10B is an example of a second region, the power wiring trace P1 is an example of a lower wiring trace, and the third insulating layer 60 is an example of a third insulating layer.

As each of constituent elements recited in the claims, various other elements having configurations or functions described in the claims can be also used.

[6] Inventive Example and Comparative Example

Figure 22A:
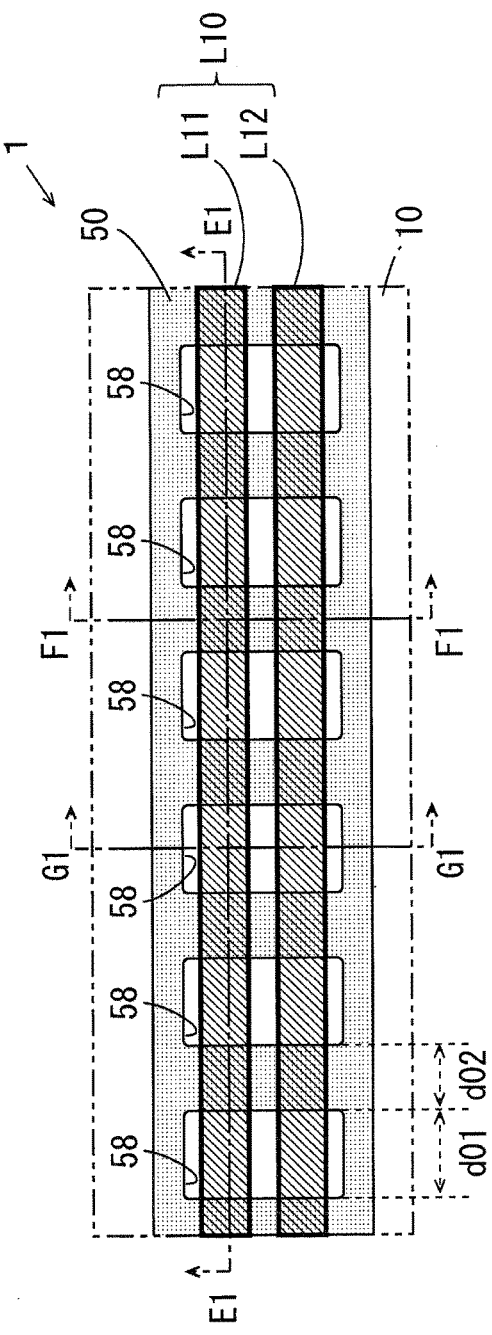
FIG. 22A is a plan view of a suspension board according to an inventive example.
Figure 22B:
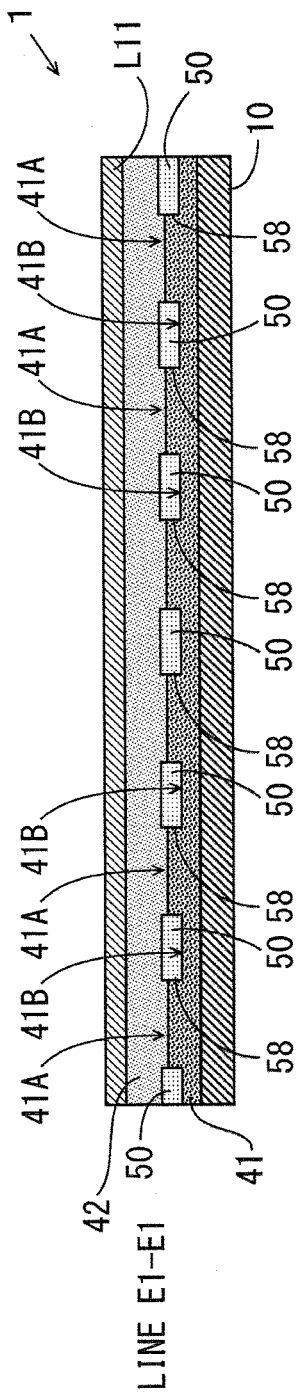
FIG. 22B is a cross sectional view taken along the line E1-E1 of FIG. 22A.

Suppose that the following suspension boards are used for the inventive example and the comparative example. FIG. 22A is a plan view of a suspension board according to the inventive example, and FIG. 22B is a cross sectional view taken along the line E1-E1 of FIG. 22A. Further, FIG. 23A is a cross sectional view taken along the line F1-F1 of FIG. 22A, and FIG. 23B is a cross sectional view taken along the line G1-G1 of FIG. 22A.

As shown in FIG. 22A, the suspension board of the inventive example includes a wiring trace L10 extending in one direction and a ground layer 50. The wiring trace L10 includes two lines L11, L12. A differential signal line pair is constituted by the lines L11, L12. The ground layer 50 is formed to extend in a strip shape in the one direction. Further, the ground layer 50 has a plurality of openings 58 arranged in the one direction and at constant intervals.

Figure 23A:
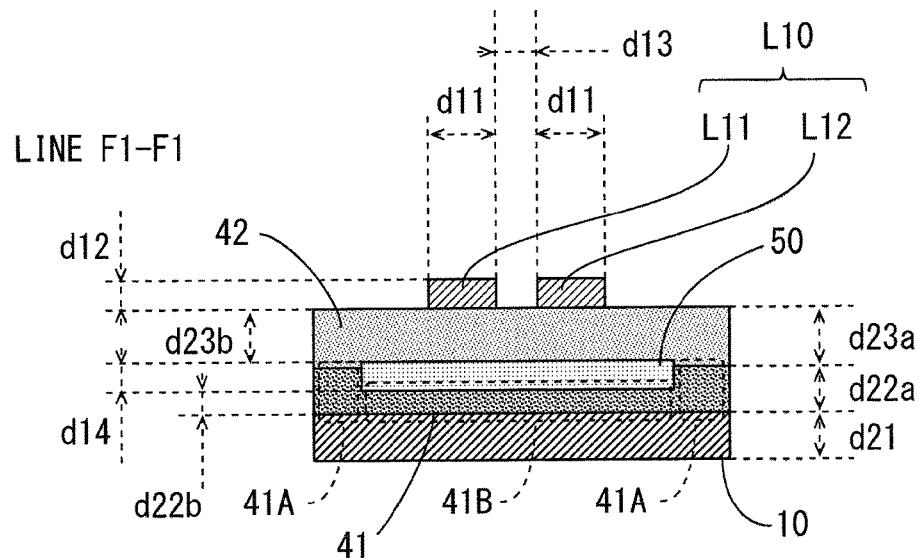
FIG. 23A is a cross sectional view taken along the line F1-F1 of FIG. 22A.
Figure 23B:
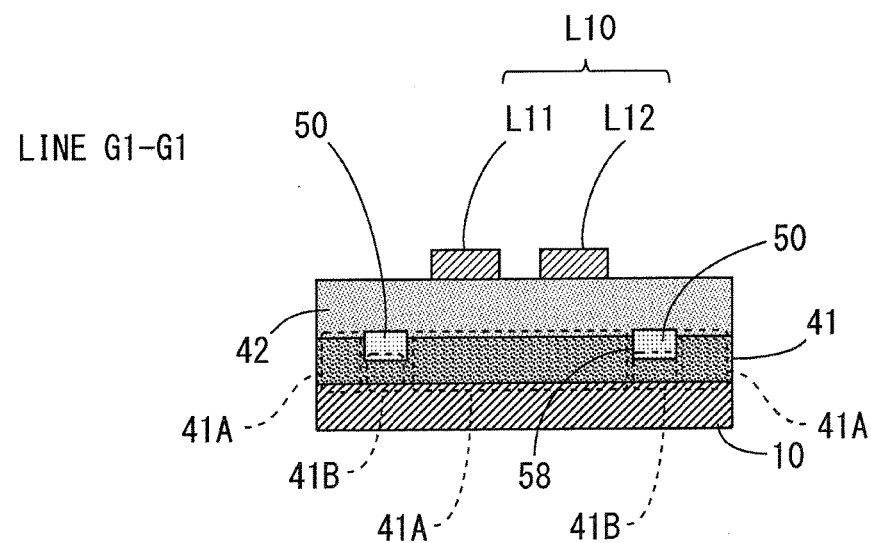
FIG. 23B is a cross sectional view taken along the line G1-G1 of FIG. 22A.

As shown in FIGS. 23A and 23B, a first insulating layer 41 made of polyimide is formed on a support substrate 10 made of stainless steel. The first insulating layer 41 includes a first portion 41A and a second portion 41B having different thicknesses. The thickness of the second portion 41B is smaller than that of the first portion 41A. A ground layer 50 made of copper is formed on the second portion 41B of the first insulating layer 41. A second insulating layer 42 made of polyimide is formed on the first insulating layer 41 to cover the ground layer 50. The wiring trace L10 made of copper is formed on the second insulating layer 42.

In FIG. 22A, the first insulating layer 41 and the second insulating layer 42 of FIGS. 22B, 23A and 23B are not shown. Further, in FIG. 22A, the wiring trace L10 is indicated by thick solid lines and hatching, and the ground layer 50 is indicated by a solid line and a dotted pattern. Further, the support substrate 10 is indicated by two-dots and dash line.

In the suspension board of the inventive example, in the substrate stacking direction, a difference between a position (height) of an upper surface of the ground layer 50 and a position (height) of an upper surface of the first portion 41A of the first insulating layer 41 is small. Thus, a level difference generated due to absence and presence of the ground layer 50 is hardly formed at the upper surface of the second insulating layer 42. Further, in the suspension board of the inventive example, the thickness of the second insulating layer 42 is adjusted by a plurality of portions such that the upper surface of the second insulating layer 42 is flat. As a result, as shown in FIG. 22B, each of the lines L11, L12 of the wiring trace L10 linearly extends.

In the suspension board of the inventive example, a length of each of the lines L11, L12 in a direction in which the wiring trace L10 extends was 20 mm. Further, a width d11 and a thickness d12 of each of the lines L11, L12 were 100 μm and 8 μm, respectively, and a distance d13 between the lines L11, L12 was 30 μm. Further, a thickness d14 of the ground layer 50 was 5 μm. Further, a thickness d21 of the support substrate 10 was 18 μm, a thickness d22a of the first portion 41A of the first insulating layer 41 was 5 μm, and a thickness d22b of the second portion 41B of the first insulating layer 41 was 1.5 μm. Further, a thickness d23a of a portion of the second insulating layer 42 that overlaps with the first portion 41A of the first insulating layer 41 was 7.5 μm, and a thickness d23b of a portion of the second insulating layer 42 that overlaps with the second portion 41B of the first insulating layer 41 was 6 μm. Further, in a direction in which the wiring trace L10 extends, a dimension d01 of each opening 58 that overlaps with the wiring trace L10 and a distance d02 between a set of two adjacent openings 58 were 500 μm and 500 μm, respectively.

Figure 25A:
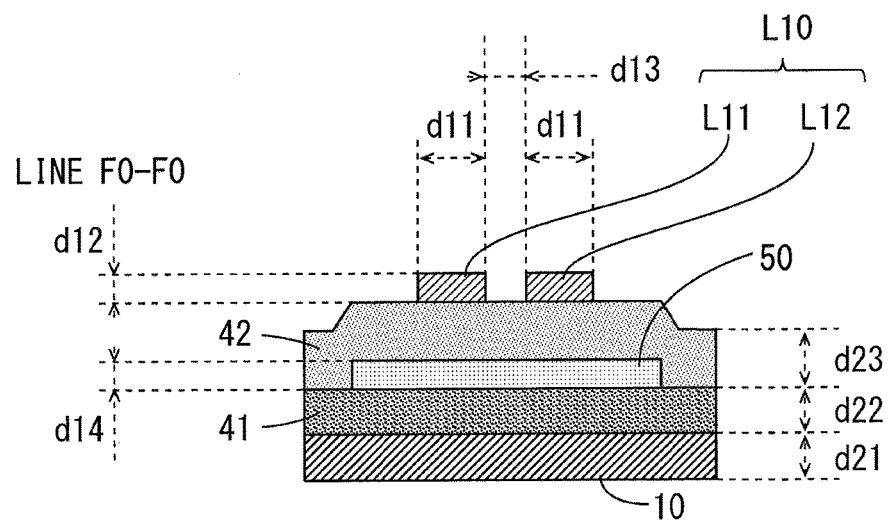
FIG. 25A is a cross sectional view taken along the line F0-F0 of FIG. 24A.
Figure 25B:
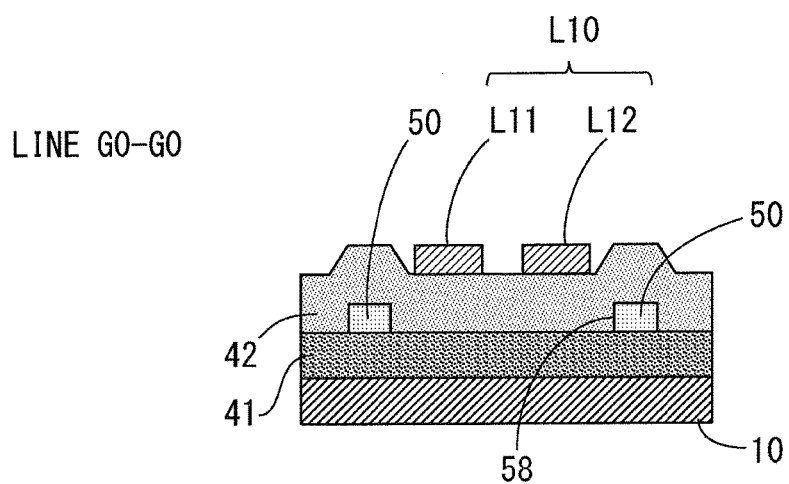
FIG. 25B is a cross sectional view taken along the line G0-G0 of FIG. 24A.

FIG. 24A is a plan view of a suspension board according to a comparative example, and FIG. 24B is a cross sectional view taken along the line E0-E0 of FIG. 24A. Further, FIG. 25A is a cross sectional view taken along the line F0-F0 of FIG. 24A, and FIG. 25B is a cross sectional view taken along the line G0-G0 of FIG. 24A. In FIG. 24A, similarly to the example of FIG. 22A, part of the constituent elements among a plurality of constituent elements of the suspension board is indicated by different display patterns, and the other constituent elements are not shown. The suspension board according to the comparative example has the same configuration as that of the suspension board of the inventive example except for the following points.

As shown in FIGS. 24B, 25A and 25B, in the suspension board of the comparative example, a first insulating layer 41 is formed to have a constant thickness and cover the entire upper surface of a support substrate 10. A ground layer 50 is formed on the first insulating layer 41.

In the suspension board of the comparative example, in the substrate stacking direction, a difference between a position (height) of an upper surface of the ground layer 50 and a position (height) of an upper surface of the first insulating layer 41 is large. Thus, a level difference generated due to presence and absence of the ground layer 50 is formed at an upper surface of a second insulating layer 42. As a result, as shown in FIG. 24B, each of lines L11, L12 of a wiring trace L10 extends in a waveform.

In the suspension board of the comparative example, a length of each of the lines L11, L12 in a direction in which the wiring trace L10 extends was 20 mm. Further, a width d11 and a thickness d12 of each of the lines L11, L12 were 100 μm and 8 μm, respectively, and a distance d13 between the lines L11, L12 was 30 μm. Further, a thickness d14 of the ground layer 50 was 5 μm. Further, a thickness d21 of the support substrate 10 was 18 μm, a thickness d22 of the first insulating layer 41 was 5 μm, and a thickness d23 of the second insulating layer 42 was 6 μm. Further, in a direction in which the wiring trace L10 extends, a dimension d01 of each opening 58 that overlaps with the wiring trace L10 and a distance d02 between a set of two adjacent openings 58 were 500 μm and 500 μm, respectively.

The dimension of each portion of the suspension boards of the inventive example and the comparative example is shown in the Table 1, described below.

TABLE 1

|  | INVENTIVE EXAMPLE | COMPARATIVE EXAMPLE |
| --- | --- | --- |
| LENGTH OF WIRING TRACE | 20 mm | 20 mm |
| WIDTH OF EACH LINE OF WIRING TRACE | 100 μm | 100 μm |
| THICKNESS OF EACH LINE OF WIRING TRACE | 8 μm | 8 μm |
| DISTANCE BETWEEN TWO LINES OF WIRING TRACE | 30 μm | 30 μm |
| THICKNESS OF GROUND LAYER | 5 μm | 5 μm |
| THICKNESS OF SUPPORT SUBSTRATE | 18 μm | 18 μm |
| THICKNESS OF FIRST INSULATING LAYER | FIRST PORTION: 5 μm SECOND PORTION: 1.5 μm | 5 μm |
| THICKNESS OF SECOND INSULATING LAYER | PORTION OVERLAPPING WITH FIRST PORTION: 7.5 μm PORTION OVERLAPPING WITH SECOND PORTION: 6 μm | 6 μm |
| DIMENSION OF EACH OPENING IN DIRECTION IN WHICH WIRING TRACE EXTENDS | 500 μm | 500 μm |
| DISTANCE BETWEEN SET OF TWO ADJACENT OPENINGS | 500 μm | 500 μm |

An S parameter Sdd21, which indicates the transmission characteristics when an electric signal is transmitted through the wiring trace L10 of the suspension board of each of the inventive example and the comparative example was found by simulation. The S parameter Sdd21 indicates an attenuation amount in a differential mode input and a differential mode output.

Figure 26:
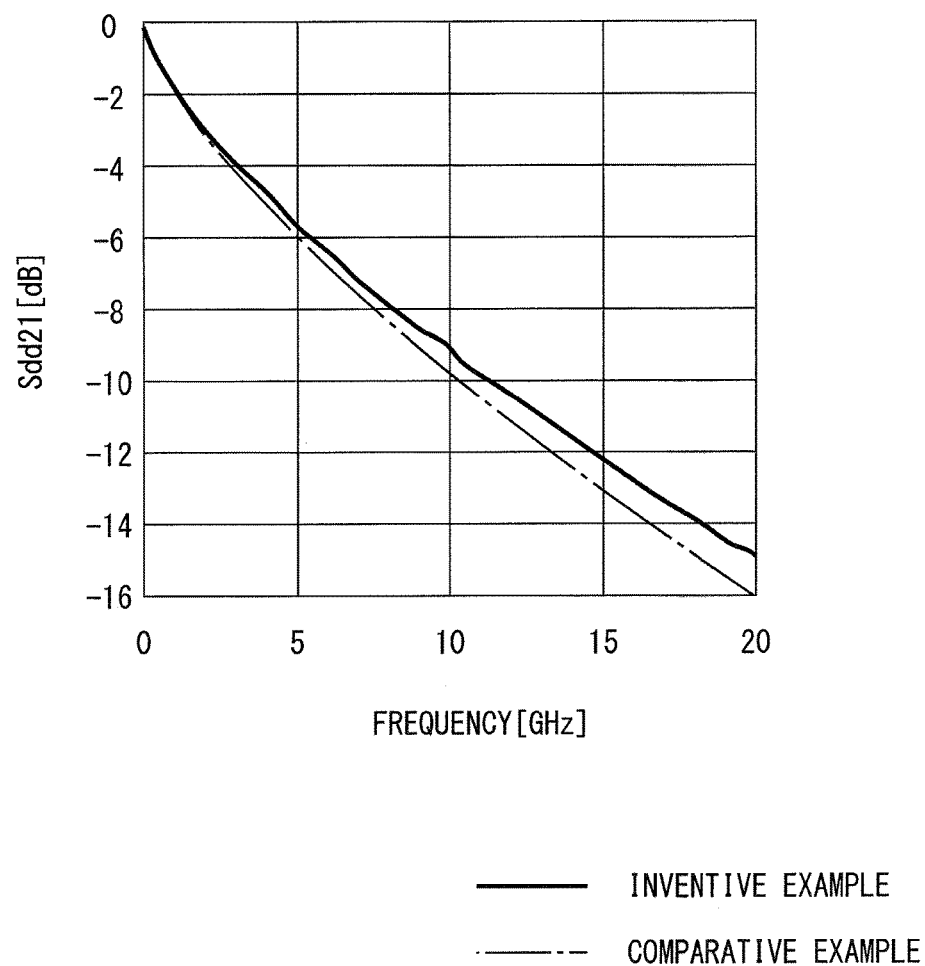
FIG. 26 is a diagram showing results of simulation relating to the suspension board of each of the inventive example and the comparative example.

FIG. 26 is a diagram showing results of simulation relating to the suspension boards of the inventive example and the comparative example. In FIG. 26, the ordinate indicates the S parameter Sdd21 [dB], and the abscissa indicates a frequency [GHz] of an electric signal. Further, in FIG. 26, the result of simulation relating to the inventive example is indicated by a thick solid line. The result of simulation relating to the comparative example is indicated by a one-dot and dash line.

In FIG. 26, a negative gain indicated by the ordinate represents the loss. Therefore, it is indicated that, the lower the value of the S parameter Sdd21 is, the larger the attenuation amount is. Further, it is indicated that, the closer the value of the S parameter Sdd21 is to 0, the smaller the attenuation amount is.

According to the results of simulation of FIG. 26, in a frequency band from 0 to 20 GHz, an attenuation amount of an electric signal transmitted in the suspension board of the inventive example is smaller than an attenuation amount of an electric signal transmitted in the suspension board of the comparative example. Thus, it was found that an attenuation amount of an electric signal could be reduced over wide frequency bands by a reduction in difference between a position (height) of the upper surface of the ground layer 50 and a position (height) of the upper surface of the first insulating layer 41 in the substrate stacking direction.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for various types of printed circuit boards.

We claim:
1. A printed circuit board comprising:
a support substrate formed of a conductive material;
a first insulating layer that is formed on the support substrate and alternately includes a plurality of first portions each having a first thickness and a plurality of second portions each having a second thickness smaller than the first thickness;
a ground layer including a plurality of conductive portions that are formed respectively on the plurality of second portions of the first insulating layer to be electrically connected to the support substrate, the plurality of conductive portions not being formed on the plurality of first portions, the ground layer having an electric conductivity higher than that of the support substrate;
a second insulating layer formed on the first insulating layer to cover the ground layer; and
an upper wiring trace formed on the second insulating layer to overlap with plurality of the first and second portions of the first insulating layer,
wherein the plurality of conductive portions of the ground layer are arranged in a first direction, and
wherein the upper wiring trace extends in the first direction.
2. The printed circuit board according to claim 1, wherein a plurality of first openings that overlap with the plurality of first portions of the first insulating layer are formed in the support substrate.

3. The printed circuit board according to claim 1, wherein the support substrate includes stainless, and the ground layer includes copper.

4. The printed circuit board according to claim 1, further comprising a third insulating layer formed on the second insulating layer to cover the upper wiring trace.

5. A printed circuit board comprising:
a support substrate formed of a conductive material;
a first insulating layer that is formed on the support substrate and includes a first portion having a first thickness and a second portion having a second thickness smaller than the first thickness;
a ground layer that is formed on the second portion of the first insulating layer to be electrically connected to the support substrate and has an electric conductivity higher than that of the support substrate;
a second insulating layer formed on the first insulating layer to cover the ground layer; and
an upper wiring trace formed on the second insulating layer to overlap with the first and second portions of the first insulating layer, and
a lower wiring trace formed on the first insulating layer, wherein the second insulating layer is formed on the first insulating layer to cover the lower wiring trace.

6. A method of manufacturing a printed circuit board including the steps of:
forming a first insulating layer that alternately includes a plurality of first portions each having a first thickness and a plurality of second portions each having a second thickness smaller than the first thickness on a support substrate formed of a conductive material;
forming a ground layer including a plurality of conductive portions and having electric conductivity higher than that of the support substrate on the plurality of second portions of the first insulating layer to be electrically connected to the support substrate, the plurality of conductive portions not being formed on the plurality of first portions, the plurality of conductive portions of the ground layer being arranged in a first direction;
forming a second insulating layer on the first insulating layer to cover the ground layer; and
forming an upper wiring trace on the second insulating layer to overlap with the plurality of first and second portions of the first insulating layer, the upper wiring trace extending in the first direction.

* * * * *